US008803415B2

(12) United States Patent
Lee et al.

(10) Patent No.: US 8,803,415 B2
(45) Date of Patent: Aug. 12, 2014

(54) ORGANIC LIGHT EMITTING DIODE DISPLAY AND METHOD FOR MANUFACTURING THE SAME

(75) Inventors: Hae-Yeon Lee, Bucheon-si (KR); Baek-Woon Lee, Yongin-si (KR); Young-In Hwang, Yongin-si (KR)

(73) Assignee: Samsung Display Co., Ltd. (KR)

( * ) Notice: Subject to any disclaimer, the term of this patent is extended or adjusted under 35 U.S.C. 154(b) by 923 days.

(21) Appl. No.: 12/470,429

(22) Filed: May 21, 2009

(65) Prior Publication Data
US 2010/0053044 A1 Mar. 4, 2010

(30) Foreign Application Priority Data

Sep. 1, 2008 (KR) ........................ 10-2008-0085859

(51) Int. Cl.
*H01L 51/50* (2006.01)
*H01L 51/52* (2006.01)
*H01L 51/54* (2006.01)
*H01L 27/32* (2006.01)

(52) U.S. Cl.
CPC ........ *H01L 51/5265* (2013.01); *H01L 51/5259* (2013.01); *H01L 27/3248* (2013.01); *H01L 27/3241* (2013.01); *H01L 27/32* (2013.01)
USPC ............ 313/503; 313/501; 313/505; 313/506

(58) Field of Classification Search
CPC ... H01L 27/3209; H01L 27/322; H01L 27/32; H01L 27/3248; H01L 51/5265; H01L 51/5259
USPC .................................................. 313/498–512
See application file for complete search history.

(56) References Cited

U.S. PATENT DOCUMENTS

| | | | |
|---|---|---|---|
| 6,392,340 B2 * | 5/2002 | Yoneda et al. | 313/506 |
| 6,791,261 B1 | 9/2004 | Shimoda et al. | |
| 6,903,378 B2 * | 6/2005 | Cok | 257/88 |
| 7,023,013 B2 | 4/2006 | Ricks et al. | |
| 7,030,553 B2 | 4/2006 | Winters et al. | |
| 7,129,634 B2 | 10/2006 | Boroson et al. | |
| 7,142,179 B2 * | 11/2006 | Miller et al. | 345/76 |
| 7,166,959 B2 * | 1/2007 | Suzuki et al. | 313/504 |

(Continued)

FOREIGN PATENT DOCUMENTS

| | | |
|---|---|---|
| JP | 2005-093329 | 4/2005 |
| JP | 2006-302506 | 11/2006 |

(Continued)

*Primary Examiner* — Nimeshkumar Patel
*Assistant Examiner* — Jose M Diaz
(74) *Attorney, Agent, or Firm* — Innovation Counsel LLP

(57) ABSTRACT

An organic light emitting diode display panel includes a transparent substrate on which a matrix array of pixels is formed with each pixel including an organic light emitting diode (OLED). The OLEDS include light emitting regions sandwiched between pixel electrodes or anodes made of transparent conductive material and a common electrode made of a conductive material. The refractive index of the pixel electrodes is higher than the refractive index of the insulating layer on which the pixel electrodes are disposed so that light undergoes multiple reflections at the interface between the pixel electrodes and the insulating layer and also at the interface between the light emitting regions and the common electrode. The thickness of the pixel electrodes is chosen so that light that eventually exits the pixel electrodes after multiple reflections contains a relatively strong component of a chosen primary color.

43 Claims, 22 Drawing Sheets

(56) References Cited

U.S. PATENT DOCUMENTS

| | | |
|---|---|---|
| 7,247,394 B2 | 7/2007 | Hatwar et al. |
| 7,816,860 B2 * | 10/2010 | Kobayashi ............... 313/504 |
| 7,839,084 B2 * | 11/2010 | Nishikawa et al. ......... 313/506 |
| 7,855,508 B2 * | 12/2010 | Cok et al. ................ 313/506 |
| 7,973,470 B2 * | 7/2011 | Cok ........................ 313/506 |
| 8,040,052 B2 * | 10/2011 | Kobayashi ............... 313/506 |
| 8,063,552 B2 * | 11/2011 | Cok et al. ................ 313/503 |
| 2003/0170491 A1 * | 9/2003 | Liao et al. ................ 428/690 |
| 2004/0217697 A1 * | 11/2004 | Lee et al. ................ 313/504 |
| 2005/0040756 A1 * | 2/2005 | Winters et al. ............. 313/504 |
| 2005/0073230 A1 * | 4/2005 | Nishikawa et al. ......... 313/111 |
| 2005/0142976 A1 * | 6/2005 | Suzuki ..................... 445/24 |
| 2005/0230684 A1 * | 10/2005 | Seo et al. ................. 257/72 |
| 2005/0280362 A1 * | 12/2005 | Shore et al. .............. 313/506 |
| 2006/0082295 A1 * | 4/2006 | Chin et al. ............... 313/506 |
| 2006/0214596 A1 * | 9/2006 | Miller et al. ............. 315/169.3 |
| 2006/0232202 A1 * | 10/2006 | Matsuda et al. ........... 313/506 |
| 2006/0250074 A1 * | 11/2006 | Lee et al. ................. 313/503 |
| 2007/0001588 A1 * | 1/2007 | Boroson et al. ............ 313/504 |
| 2007/0024186 A1 * | 2/2007 | Chen et al. ............... 313/504 |
| 2007/0057264 A1 * | 3/2007 | Matsuda ................... 257/88 |
| 2007/0176859 A1 * | 8/2007 | Cok et al. ................. 345/76 |
| 2007/0286944 A1 * | 12/2007 | Yokoyama et al. .......... 427/66 |
| 2008/0203898 A1 * | 8/2008 | Kobayashi ............... 313/498 |
| 2008/0218071 A1 * | 9/2008 | Kobayashi ............... 313/506 |
| 2009/0051283 A1 * | 2/2009 | Cok et al. ................ 313/506 |
| 2009/0200921 A1 * | 8/2009 | Lee et al. ................. 313/504 |
| 2010/0194717 A1 * | 8/2010 | Mori et al. ............... 345/204 |
| 2011/0101855 A1 * | 5/2011 | Mizuno ................... 313/504 |
| 2011/0222006 A1 * | 9/2011 | Imanishi et al. ............ 349/124 |
| 2012/0001072 A1 * | 1/2012 | Toda et al. .............. 250/339.05 |
| 2012/0012960 A1 * | 1/2012 | Yang et al. ............... 257/432 |
| 2012/0013989 A1 * | 1/2012 | Choi et al. ............... 359/642 |

FOREIGN PATENT DOCUMENTS

| | | |
|---|---|---|
| JP | 2007-012370 | 1/2007 |
| JP | 2007-026852 | 2/2007 |
| JP | 2007-115626 | 5/2007 |
| KR | 10-2007-0058765 | 6/2007 |

\* cited by examiner

FIG. 2

| B | W | B | W | B |
|---|---|---|---|---|
| G | R | G | R | G |
| B | W | B | W | B |
| G | R | G | R | G |
| B | W | B | W | B |

FIG. 21

| G | B | R | G | B |
|---|---|---|---|---|
| B | R | G | B | R |
| R | G | B | R | G |
| G | B | R | G | B |
| B | R | G | B | R |

ORGANIC LIGHT EMITTING DIODE DISPLAY AND METHOD FOR MANUFACTURING THE SAME

CROSS-REFERENCE TO RELATED APPLICATION

This application claims the benefit of priority of Korean Patent Application No. 10-2008-0085859 filed in the Korean Intellectual Property Office on Sep. 1, 2008, the contents of which are incorporated herein by reference.

BACKGROUND OF THE INVENTION (a) Field of the Invention

The present invention relates to an organic light emitting device and a manufacturing method thereof.

(b) Description of the Related Art

Since an organic light emitting display (OLED) is a self emissive display, it does not require a light source. Therefore, the OLED consumes relatively less power than other displays. Also, the OLED has a fast response speed, a wide viewing angle, and an excellent contrast ratio.

The OLED includes a plurality of primary color pixels such as red pixels, blue pixels, and green pixels, and displays a full range of colors composed of the spatial sum of primary colors emitted through a combination of these pixels.

Each pixel of the OLED includes an organic light emitting element and a plurality of thin film transistors for driving the organic light emitting element.

The organic light emitting element includes an anode, a cathode, and an organic light emitting member interposed between the anode and the cathode. The organic light emitting member emits light of one of three primary colors, for example, red, green, and blue, or emits white light. A material of the organic light member may vary according to the color emitted from the organic light emitting member. In the case of white light, materials each emitting one of the colors, red, green, and blue are stacked, and the white light is the sum of the red, green, and blue light emitted from the stacked materials. Also, when using an organic light emitting member that emits white light, color filters may be used to obtain light of a desired color.

However, after passing through the color filters, color purity of light deteriorates due to a limitation in color reproducibility of the color filters.

The above information, disclosed in this Background section, is provided only for enhancement of understanding of the background of the invention and therefore it may contain information that does not form part of the prior art.

SUMMARY OF THE INVENTION

The present invention has been made in an effort to provide an organic light emitting device having advantages of improved color reproducibility and improved range of viewing angle.

The present invention provides an organic light emitting display comprising: a substrate comprising a first region, a second region, a third region, and a fourth region respectively corresponding to a red pixel, a green pixel, a blue pixel, and a white pixel; a thin film transistor array disposed on the substrate and comprising a first driving transistor disposed on the first region, a second driving transistor disposed on the second region, a third driving transistor disposed on the third region and a fourth driving transistor disposed on the fourth region; an overcoat disposed on the thin film transistor array; first, second, third, and fourth pixel electrodes disposed on and contacting the overcoat, the first pixel electrode disposed at the first region, the second pixel electrode disposed on the second region, the third pixel electrode disposed on the third region, and the fourth pixel electrode disposed on the fourth region, respectively; an organic light emitter disposed on the first, second, third, and fourth pixel electrodes; and a common electrode disposed on the organic light emitter. Thicknesses of the first, third, and fourth pixel electrodes are substantially equal to each other and different from the thickness of the second pixel electrode.

A refractive index difference between the overcoat and the first to fourth pixel electrodes may be 0.2 or greater.

The first, second, third, and fourth pixel electrodes may comprise ITO or IZO.

The overcoat may comprise an organic material.

The second pixel electrode may be thicker than the first, third, and fourth pixel electrodes.

The second pixel electrode may comprise a lower transparent electrode and an upper transparent electrode.

First, second, third, and fourth contact holes formed in the overcoat extend to portions of the first, third, and fourth driving transistors respectively; the first, third, and fourth pixel electrodes comprise a transparent conductor which is disposed in the first, third, and fourth contact holes and contacts the portions of the first, third, and fourth driving transistors respectively; and lower first transparent electrode of the second pixel electrode is disposed on the overcoat and contacts the second driving transistor through the second contact hole.

The first, second, third, and fourth pixel electrodes may comprise ITO or IZO.

The overcoat may comprise an organic material.

First, second, third, and fourth contact holes formed in the overcoat extend to portions of the first, second, third, and fourth driving transistors respectively; the first, third, and fourth pixel electrodes contact the portions of the first, third, and fourth driving transistors through the first, third, and fourth contact holes; and the upper transparent electrode of the second pixel electrode contacts the second driving transistor through the second contact hole.

The second contact hole may penetrate the lower transparent electrode of the second pixel electrode.

The first, second, third, and fourth pixel electrodes may comprise ITO or IZO.

The overcoat may comprise an organic material.

The thickness of the second pixel electrode may be between about 1400 Å and about 1600 Å, and the thickness of the first, third, and fourth pixel electrodes may be between about 800 Å and about 1000 Å.

The second pixel electrode may be thinner than the first, third, and fourth pixel electrodes.

Each of the first, third, and fourth pixel electrodes may comprise a lower transparent electrode and an upper transparent electrode.

The thickness of the second pixel electrode may be between about 300 Å and about 500 Å, and the thickness of the first, third, and fourth pixel electrodes may be between about 800 Å and about 1000 Å.

The organic light emitting device may further comprise first, second, and third color filters disposed on the thin film transistor array and disposed at the first, second, and third regions, respectively.

The organic light emitting device may further comprise a fourth color filter disposed on the thin film transistor array and disposed at the fourth region.

The organic light emitter may be a white organic light emitting member.

The organic light emitter may comprise first, second, third, and fourth organic light emitting members disposed at the first, second, third, and fourth regions, respectively.

BRIEF DESCRIPTION OF THE DRAWINGS

FIG. 2 is a plan view illustrating a plurality of pixels in an organic light emitting device according to an exemplary embodiment of the present invention.

FIG. 21 is a plan view illustrating a plurality of pixels disposed in an organic light emitting device according to another exemplary embodiment of the present invention.

DESCRIPTION OF REFERENCE NUMERALS INDICATING PRIMARY ELEMENTS IN THE DRAWINGS

Figure 1:
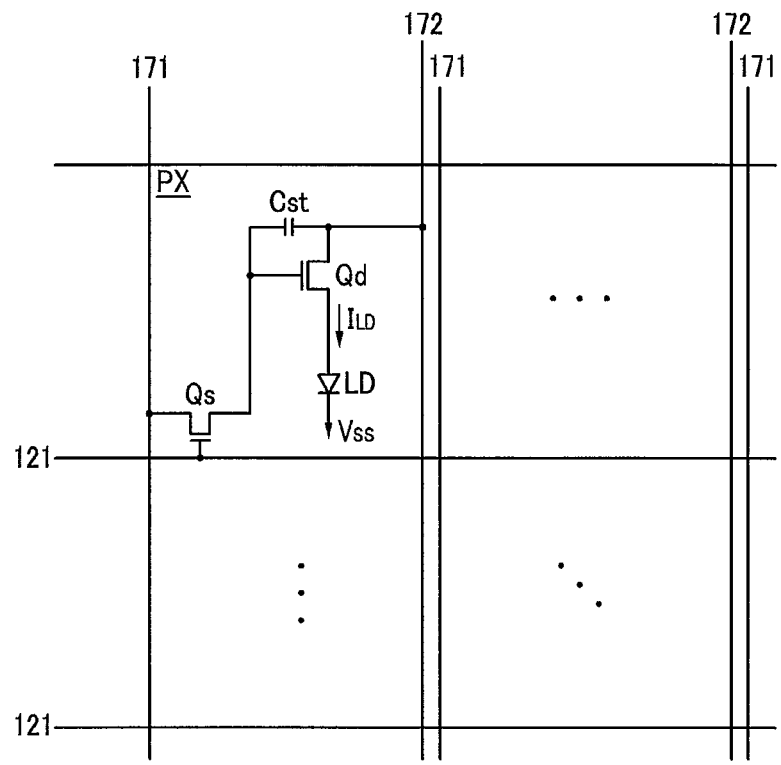
FIG. 1 is an equivalent circuit diagram of an organic light emitting device according to an exemplary embodiment of the present invention.

| | |
|---|---|
| 110: insulation substrate | 112: insulating layer |
| 121: gate line | 171: data line |
| 172: driving voltage line | 180: overcoat |
| 185R, 185G, 185B, 185W: contact hole | |
| 191R, 191G, 191B, 191W: pixel electrode | |
| 230R, 230G, 230B, 230W: color filter | |
| 270: common electrode | 361: insulating member |
| 370, 370R, 370G, 370B, 370W: organic light emitting member | |
| Cst: storage capacitor | $I_{LD}$: driving current |
| LD: organic light emitting element | PX, R, G, B, W: pixel |
| Qs, QsR, QsG, QsB, QsW: switching transistor | |
| Qd, QdR, QdG, QdB, QdW: driving transistor | |

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, an organic light emitting device according to an exemplary embodiment of the present invention will be described in detail with reference to FIG. 1.

FIG. 1 is an equivalent circuit diagram of an organic light emitting device according to an exemplary embodiment of the present invention.

Referring to FIG. 1, the organic light emitting device according to the present exemplary embodiment includes a plurality of pixels PX that are arranged in a matrix array and connected to a plurality of signal lines 121, 171, and 172.

The signal lines include a plurality of gate lines 121 for transferring a gate signal (or scanning signal), a plurality of data lines 171 for transferring a data signal, and a plurality of driving voltage lines 172 for transferring a driving voltage. The gate lines 121 extend in a row direction parallel to each other, and the data lines 171 extend in a column direction parallel to each other. Although the driving voltage lines 172 extend in a column direction in FIG. 1, they may extend in a row direction or a column direction, or may be formed in a mesh style.

Each pixel PX includes a switching transistor Qs, a driving transistor Qd, a storage capacitor Cst, and an organic light emitting element LD.

The switching transistor Qs includes a control terminal, an input terminal and an output terminal. The control terminal is connected to the gate line 121, the input terminal is connected to the data line 171, and the output terminal is connected to the driving transistor Qd. The switching transistor Qs transfers a data signal received from the data line 171 to the driving transistor Qd in response to a scanning signal from the gate line 121.

The driving transistor Qd also includes a control terminal, an input terminal, and an output terminal. The control terminal of the driving transistor Qd is connected to the output terminal of the switching transistor Qs, the input terminal of the driving transistor Qd is connected to the driving voltage line 172, and the output terminal of the driving transistor Qd is connected to the organic light emitting element LD. The driving transistor Qd provides an output current $I_{LD}$, the magnitude of which is controlled by a voltage applied between the control terminal of the driving transistor Qd and the input terminal of the driving transistor Qd.

The capacitor Cst is connected between the control terminal and the input terminal of the driving transistor Qd. The capacitor Cst stores a data voltage that is applied between the control terminal and the input terminal of the driving transistor Qd and maintains the stored data voltage even after the switching transistor Qs is turned off.

The organic light emitting element LD, for example an organic light emitting diode, includes an anode connected to the output terminal of the driving transistor Qd and a cathode connected to a common voltage Vss. The output current $I_{LD}$ passes through the light emitting element LD. The organic light emitting element LD displays images by emitting light with an intensity that is related to the magnitude of output current $I_{LD}$ of the driving transistor Qd. The organic light emitting element LD may include an organic material that uniquely emits light of at least one of a set of primary colors such as red, green, and blue, or may include an organic material that emits white light. The organic light emitting device displays images that include desired colors, the desired colors being a spatial sum of these primary colors.

Although the switching transistor Qs and the driving transistor Qd are n-channel field effect transistors (FET), at least one of them may be a p-channel field effect transistor. Also, connection relationships among the transistors Qs, and Qd, the capacitor Cst, and the organic light emitting element LD may be modified.

Hereinafter, a pixel layout of the organic light emitting device of FIG. 1 will be described with reference to FIG. 2.

Figure 2:
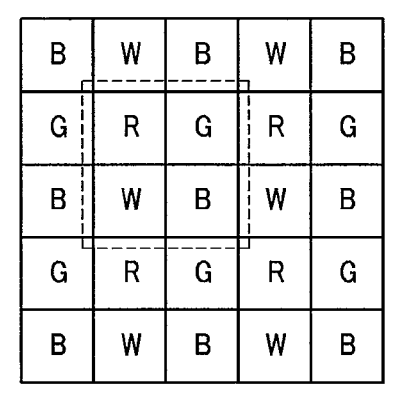

FIG. 2 is a plan view illustrating a plurality of pixels disposed in an organic light emitting device according to an exemplary embodiment of the present invention.

Referring to FIG. 2, an organic light emitting device according to an exemplary embodiment of the present invention includes red pixels R for displaying red, green pixels G for displaying green, blue pixels B for displaying blue and white pixels W for displaying no specific color but for emitting white light, these pixels being alternately arranged on a substrate. The red pixels R, the green pixels G, and the blue pixels B are basic pixels which are used together for displaying a full range of colors. Instead of the three primary colors red, green, and blue, the organic light emitting device may include pixels that emit a different set of three primary colors. The white pixel W is used for enhancing luminance and may be omitted.

Four pixels including a red pixel R, a green pixel G, a blue pixel B, and a white pixel W can be arranged to form one group such as the group of pixels enclosed by the dashed line in FIG. 2. Such groups of four pixels may be arranged in columns and rows. However, the pixel layout may be modified in various ways.

Hereinafter, details of a structure of the organic light emitting device shown in FIG. 1 and FIG. 2 will be described with reference to FIG. 3.

Figure 3:
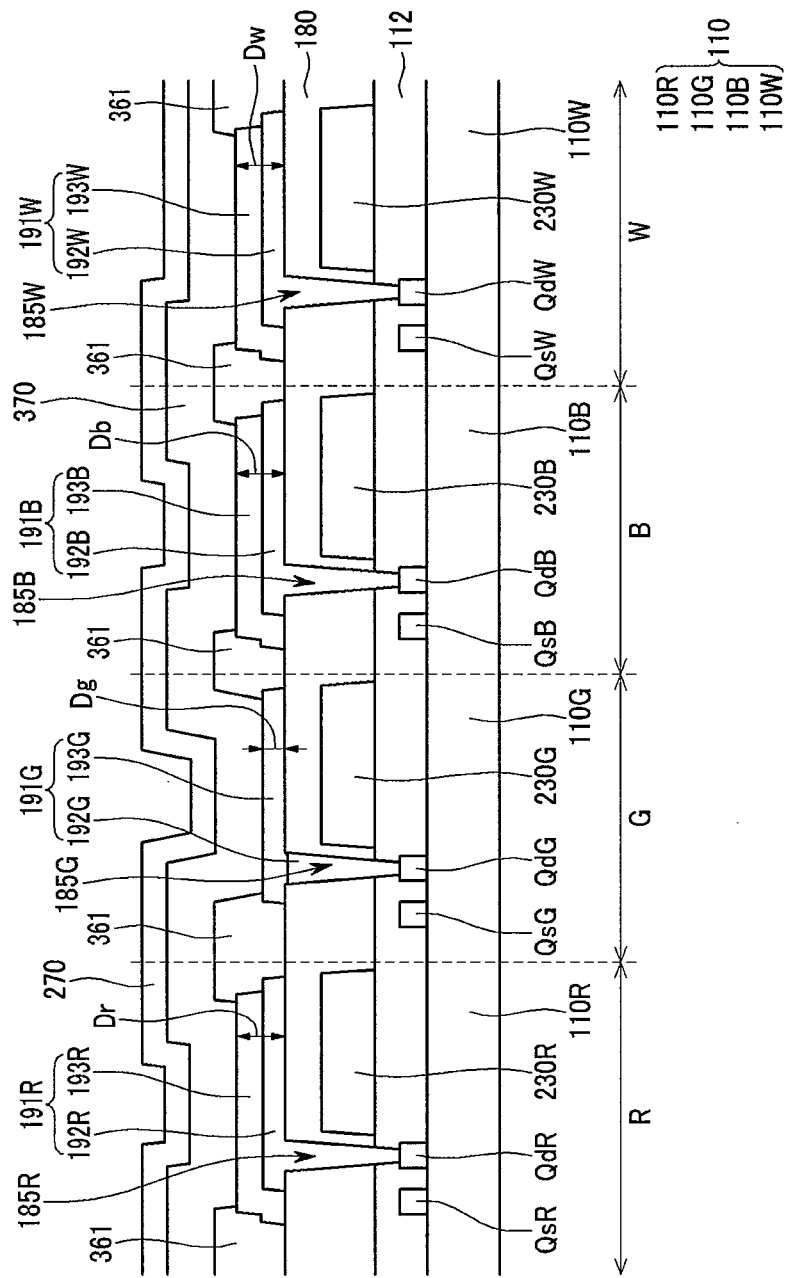
FIG. 3 is a cross-sectional view of an organic light emitting device according to an exemplary embodiment of the present invention.

FIG. 3 is a cross-sectional view including a composite of four cross-sections including a cross-section of a red pixel R, a cross-section of a green pixel G, a cross-section of a blue pixel B, and a cross-section of a white pixel W of an organic light emitting device according to an exemplary embodiment of the present invention.

The organic light emitting device includes an insulating substrate 110 that may be made of transparent glass or plastic. The insulating substrate 110 includes first regions 110R, second regions 110G, third regions 110B and fourth regions 110W. A red pixel R is disposed on each first region 110R, a green pixel G is disposed on each second region 110G, a blue pixel B is disposed on each third region 110B, and a white pixel W is disposed on each fourth region 110W. A thin film transistor array including a plurality of switching transistors QsR, QsG, QsB, and QsW and a plurality of driving transistors QdR, QdG, QdB, and QdW are disposed on the insulating substrate 110. The red pixel R includes a first switching transistor QsR and a first driving transistor QdR. The green pixel G includes a second switching transistor QsG and a second driving transistor QdG. The blue pixel B includes a third switching transistor QsB and a third driving transistor QdB. The white pixel W includes a fourth switching transistor QsW and a fourth driving transistor QdW. Although not shown in FIG. 3, the first switching transistor QsR and the first driving transistor QdR are electrically connected to each other. The first switching transistor QsR and the first driving transistor QdR may be connected together as previously described and_further description is omitted here. Likewise the switching transistors QsG, QsB and QSW are connected to the driving transistors QdG, QdB and QdW, respectively.

An insulating layer 112 is disposed on the thin film transistor array including the switching transistors QsR, QsG, QsB, and QsW and the driving transistors QdR, QdG, QdB, and QdW.

On the insulating layer 112, the red pixel R includes a red color filter 230R also referred to as a first color filter, the green pixel G includes a green color filter 230G also referred to as a second color filter, the blue pixel B includes a blue color filter 230B also referred to as a third color filter, and the white pixel W includes a transparent white color filter 230W also referred to as a fourth color filter. The white color filter 230W of the white pixel W may be omitted.

An overcoat 180 is disposed on the color filters 230R, 230G, 230B, and 230W, and on the insulating layer 112. The overcoat 180 may be made of an organic material and may have a flat surface.

A plurality of contact holes including a first contact hole 185R, a second contact hole 185G, a third contact hole 185B, and a fourth contact hole 185W are formed in the overcoat 180 and the insulating layer 112, and extend to a portion of the output terminal (not shown) of the driving transistors QdR, QdG, QdB and QdW, respectively.

Pixel electrodes, including a first pixel electrode 191R, a second pixel electrode 191G, a third pixel electrode 191B, and a fourth pixel electrode 191W are disposed on the overcoat 180, and are located above the color filters 230R, 230G, 230B, and 230W, respectively.

Each of the pixel electrodes 191R, 191B, and 191W of the red, blue, and white pixels R, B, and W includes a lower transparent electrode and an upper transparent electrode. The pixel electrodes 191R, 191B, and 191W include a first lower transparent electrode 192R, a third lower transparent electrode192B, and a fourth lower transparent electrode 192W, respectively at the bottom thereof and a first upper transparent electrode 193R, a third upper transparent electrode 193B, and a fourth upper transparent electrode 193W at the top thereof.

The second pixel electrode 191G of the green pixel G includes a transparent electrode 193G formed of a single layer and a transparent conductor 192G disposed in the contact hole 185G.

The lower transparent electrodes 192R, 192B, and 192W of the red, blue, and white pixels R, B, and W are disposed on the overcoat 180 and in the contact holes 185R, 185B, and 185W, and are electrically connected to the driving transistors QdR, QdB and QdW through the contact holes 185R, 185B, and 185W, respectively. The upper transparent electrodes 193R, 193B, and 193W are respectively disposed on the lower transparent electrodes 192R, 192B, and 192W, and also may in part be disposed on the overcoat 180.

The transparent conductor 192G of the green pixel G is not present on the overcoat 180 but is disposed only in the second contact hole 185G. The transparent electrode 193G is disposed on the transparent conductor 192G and on the overcoat 180, and is electrically connected to the driving transistor QdG via the transparent conductor 192G.

The lower transparent electrodes 192R, 192B, 192W, and the transparent conductor 192G may be formed in a first layer of transparent conductive material, the upper transparent electrodes 193R, 193B, and 193W, and the transparent electrode 193G may be formed in a second layer of transparent conductive material. The first layer and the second layer of transparent conductive material may be made of a transparent conductive material such as indium tin oxide (ITO) or indium zinc oxide (IZO).

As shown in FIG. 3, a thickness Dg of the pixel electrode 191G of the green pixel G is less than that of the pixel electrodes 191R, 191B, and 191W of the red, blue, and white pixels R, B, and W. The thickness Dg of the pixel electrode 191G may be between about 300 Å and about 500 Å, and the thicknesses Dr, Db, and Dw of the pixel electrodes 191R, 191B, and 191W may be between about 800 Å and about 1000 Å. The thicknesses Dr, Db, and Dw are substantially equal.

Alternatively, each of the pixel electrodes 191R, 191G, 191B, and 191W may be formed of a single layer including ITO or IZO. In this case, the thickness Dg of the pixel electrode 191G may be also thinner than the thicknesses Dr, Db, and Dw of the pixel electrodes 191R, 191B, and 191W.

The pixel electrodes 191R, 191G, 191B, and 191W have a refractive index that is greater than the refractive index of the overcoat 180. The refractive index difference therebetween may be 0.2 or greater. For example, when a refractive index of the overcoat 180 made of an organic layer is between about 1.5 and about 1.7, a refractive index of the pixel electrodes 191R, 191G, 191B, and 191W made of ITO or IZO may be between about 1.8 and about 2.3. Due to the refractive index difference between the overcoat 180 and the pixel electrodes 191R, 191G, 191B, and 191W, at least a portion of incident light entering the pixel electrodes 191R, 191G, 191B, and 191W from above is reflected at the interface or boundary between the pixel electrodes 191R, 191G, 191B and 191W and the overcoat 180.

A plurality of insulating members 361 are disposed on the overcoat 180 between the adjacent pixel electrodes 191R, 191G, 191B, and 191W to provide insulation between the pixel electrodes 191R, 191B, 191G, and 191W. The insulating members 361 may be omitted.

A light emitter is disposed on the insulating members 361 and the pixel electrodes 191R, 191G, 191B, and 191W. The light emitter may be an organic light emitter, which in this embodiment is a white organic light emitting member 370. A common electrode 270, to which a common voltage Vss may be applied, is disposed on the white organic light emitting member 370.

The white organic light emitting member 370 may have a stacked structure that includes a plurality of organic material layers each emitting a different color from a set of primary colors. The common electrode 270 may be made of a reflective metal including calcium (Ca), barium (Ba), magnesium (Mg), aluminum (Al), or silver (Ag).

Alternatively, the organic light emitter may include organic light emitting members (not shown) including red, green and blue light emitting members, and a white organic light emitting member, that may be disposed in the red, green, blue, and white pixels R, G, B, and W, respectively. In this case, the red, green, and blue color filters 230R, 230G, and 230B, and the white color filter 230W, may be omitted.

In the organic light emitting device shown in FIG. 3, the pixel electrodes 191R, 191G, 191B, and 191W, the organic light emitting member 370, and the common electrode 270 form organic light emitting elements LD, wherein the pixel electrodes 191R, 191G, 191B, and 191W are anodes. Also, the common electrode 270 is a common cathode that is shared by the light emitting elements LD.

Such an organic light emitting device emits light in a downward direction through the insulating substrate 110, thereby displaying images. The light emitted from the organic light emitting member 370 toward the substrate 110 passes through the pixel electrodes 191R, 191G, 191B, and 191W and reaches a boundary between the pixel electrodes 191R, 191G, 191B, and 191W and the overcoat 180. At the boundary, light is reflected toward the common electrode 270, and at the common electrode 270 this light is reflected again so that the light again reaches the boundary between the pixel electrodes 191R, 191G, 191B, and 191W and the overcoat 180. In this way, light that is repeatedly reflected at the common electrode 270 and at the boundary between the pixel electrodes 191R, 191G, 191B, and 191W and the overcoat 180, as described above, undergoes an optical process such as interference, and as a result, a predetermined wavelength of light may be intensified. Light with an intensified predetermined wavelength is emitted after passing out of the overcoat 180 and this modified light then passes through the color filters 230R, 230G, 230B, and 230W.

The optical path lengths are dependent on thicknesses and refractive indexes of the thin films disposed between the overcoat 180 and the common electrode 270. It is possible to obtain desired optical characteristics, for example, a desired range of wavelengths and a desired color purity for respective wavelengths, by properly controlling the thicknesses Dr, Dg, Db, and Dw of the pixel electrodes 191R, 191G, 191B, and 191W as well as the thickness of the organic light emitting member 370 while particularly controlling the thickness Dg of the pixel electrode 191G of the green pixel G to be different from the thicknesses Dr, Db, and Dw of the pixel electrodes 191R, 191B, and 191W of the other pixels R, B, and W. Also, light transmittance of a desired range of wavelengths for each of the primary colors including green may be increased, and color variation at side viewing angles may be reduced.

In particular, as the refractive index difference between the overcoat 180 and the pixel electrodes 191R, 191G, 191B, and 191W is made greater, it is possible to further increase the reflectance at the boundary between the overcoat 180 and the pixel electrodes 191R, 191G, 191B, and 191W and thus further improve the color purity.

Hereinafter, a manufacturing method of manufacturing the organic light emitting device of FIG. 3 will be described with reference to FIG. 4 to FIG. 12.

FIG. 4 to FIG. 12 are cross-sectional views of an organic light emitting device of FIG. 3 in intermediate steps of a manufacturing method of an organic light emitting device according to an exemplary embodiment of the present invention.

Figure 4:
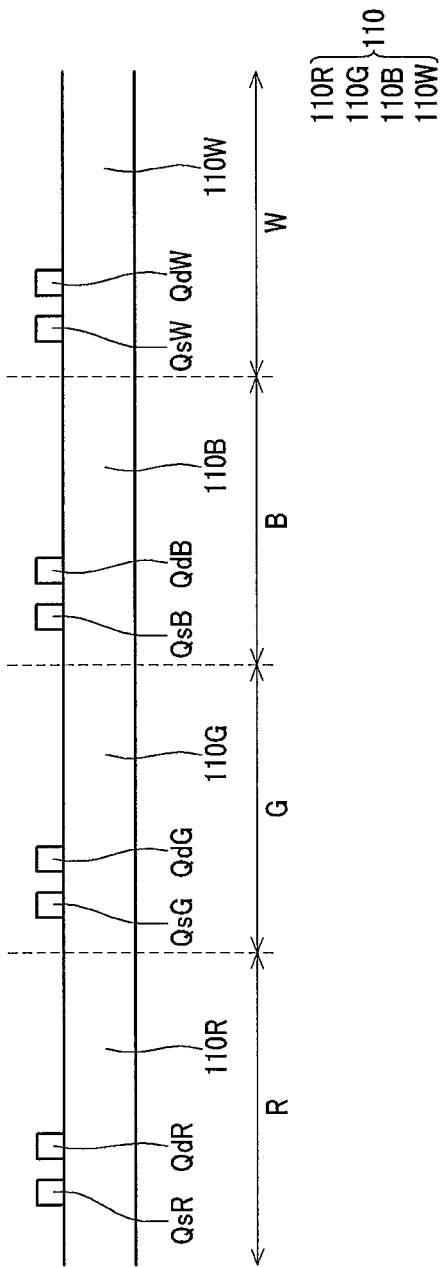
FIG. 4 to FIG. 12 are cross-sectional views of an organic light emitting device of FIG. 3 at intermediate steps of a manufacturing method of an organic light emitting device according to an exemplary embodiment of the present invention.

Referring FIG. 4, a thin film transistor array including a plurality of switching transistors QsR, QsG, QsB and QsW and a plurality of driving transistors QdR, QdG, QdB, and QdW is formed on a substrate 110.

Figure 5:
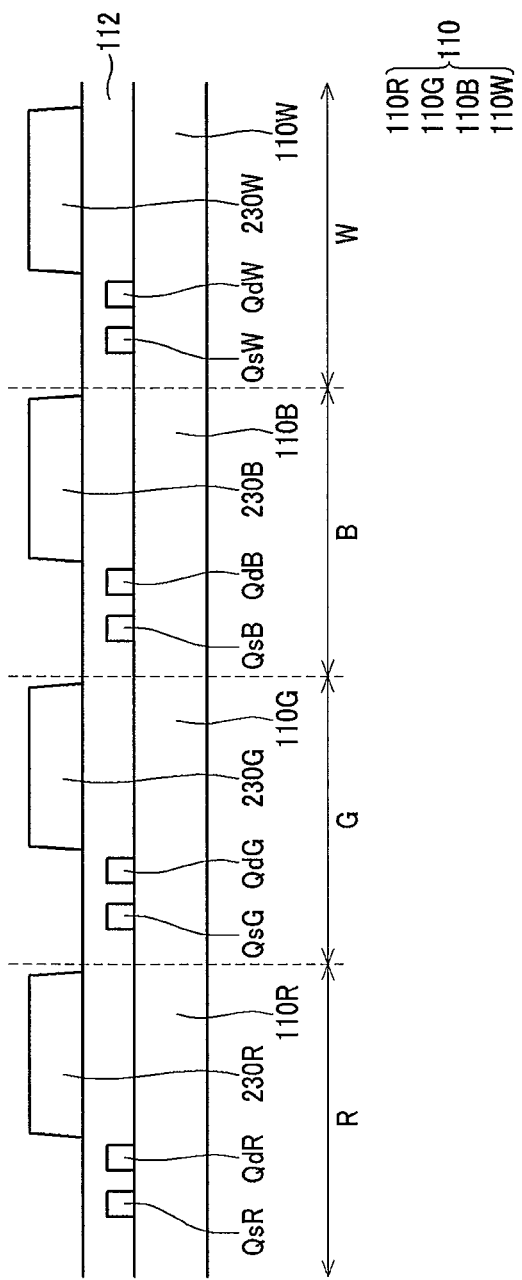

Referring to FIG. 5, an insulating layer 112 is deposited on the thin film transistor array and a plurality of color filters 230R, 230G, 230B, and 230W are formed on the insulating layer 112.

Figure 6:
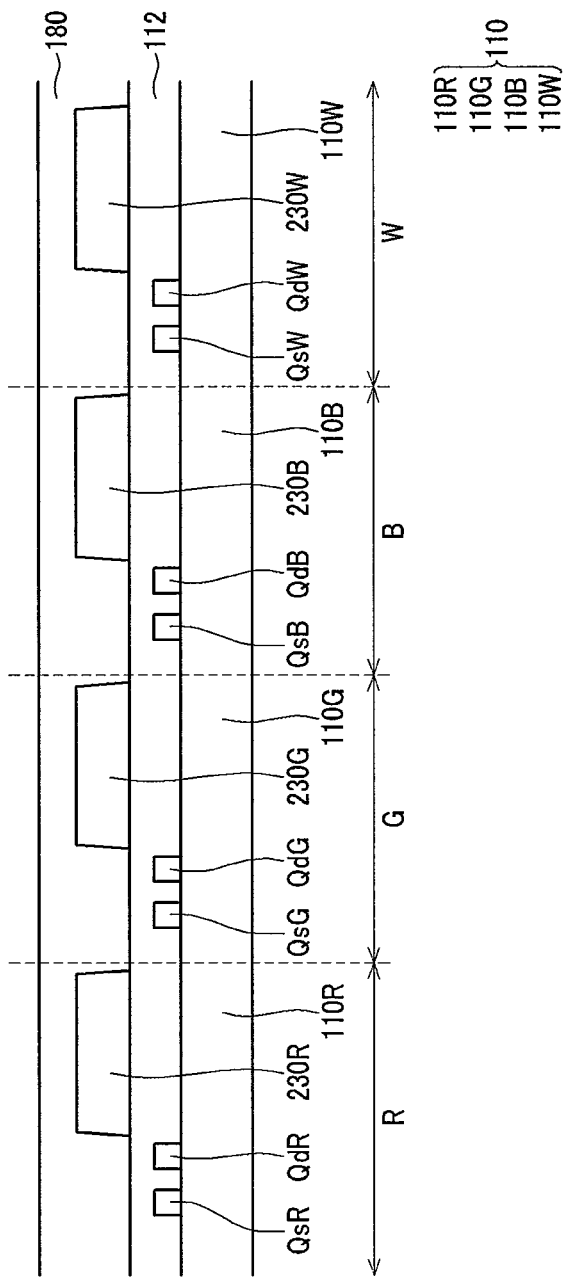
Figure 7:
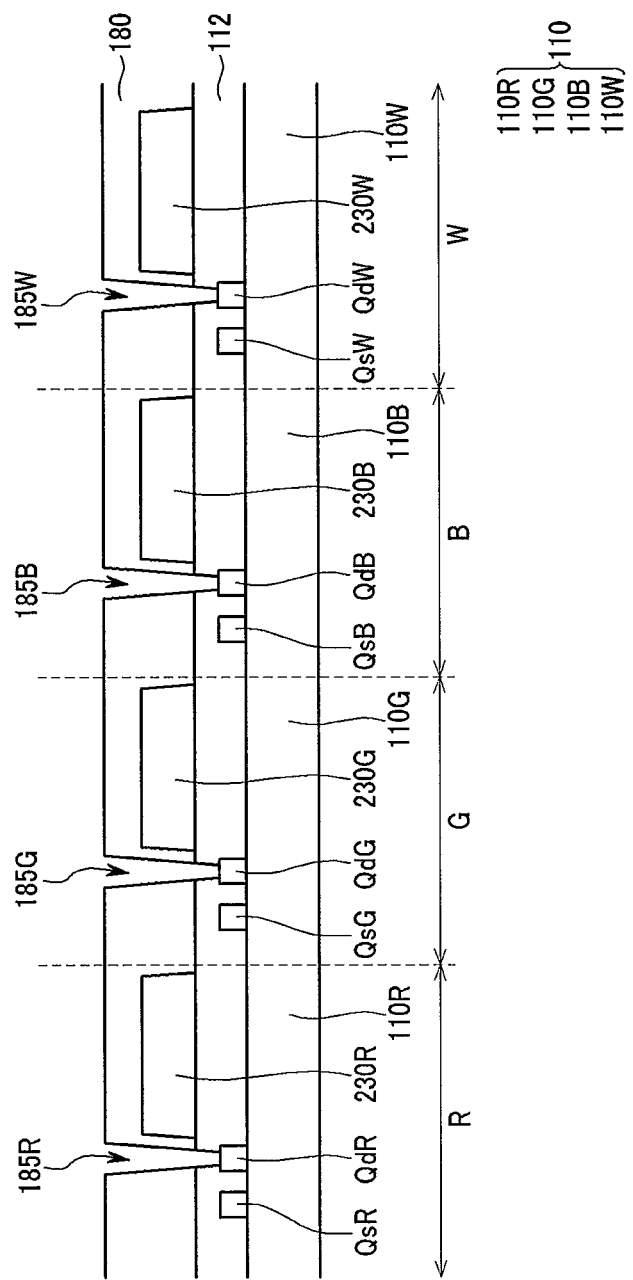

Referring to FIG. 6 and FIG. 7, an overcoat 180 is formed on the insulating layer 112 and on the color filters 230R, 230G, 230B, and 230W. Then, a plurality of contact holes 185R, 185G, 185B, and 185W are formed by patterning the insulating layer 112 and the overcoat 180. The contact holes 185R, 185G, 185B, and 185W extend through the overcoat 180 and the insulating layer 112 to the output terminals (not shown) of the driving transistors QdR, QdG, QdB, and QdW, respectively.

Figure 8:
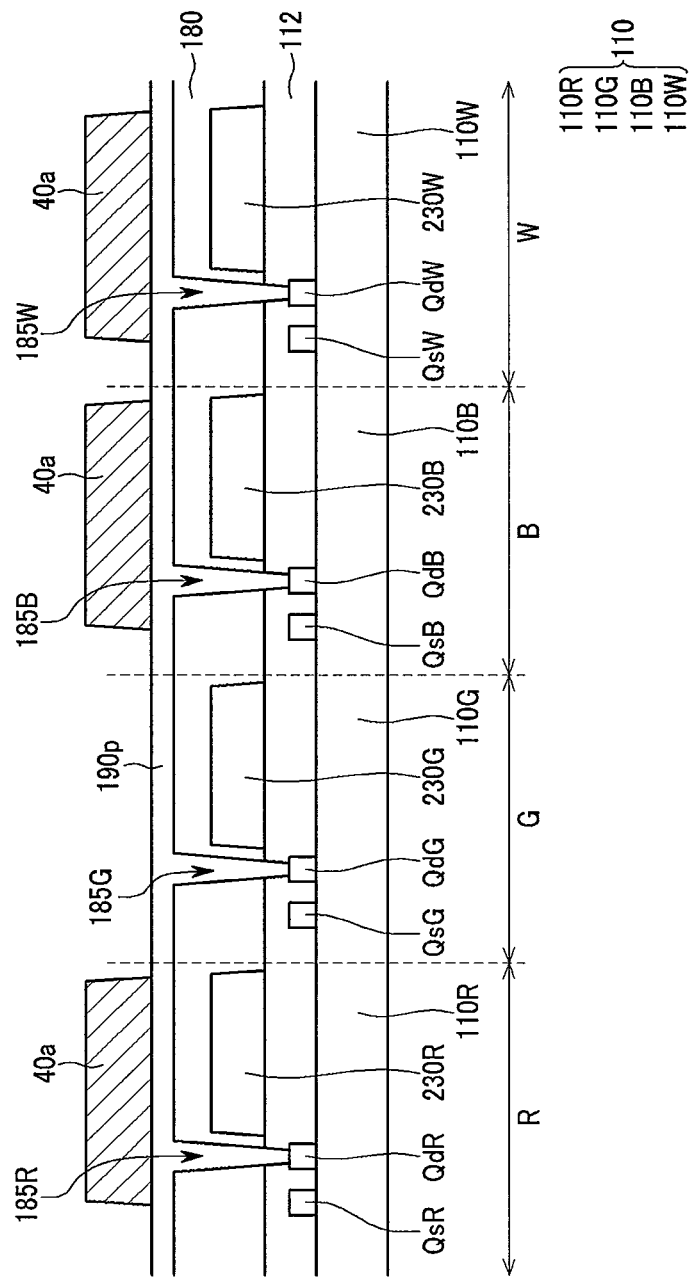

Referring to FIG. 8, a first transparent conductive layer 190p made of ITO or IZO is formed on the overcoat 180 by, for example, a sputter deposition process.

Then, a first photosensitive film is coated on the first transparent conductive layer 190p, and a first photoresist pattern 40a is formed by patterning the first photosensitive film.

Figure 9:
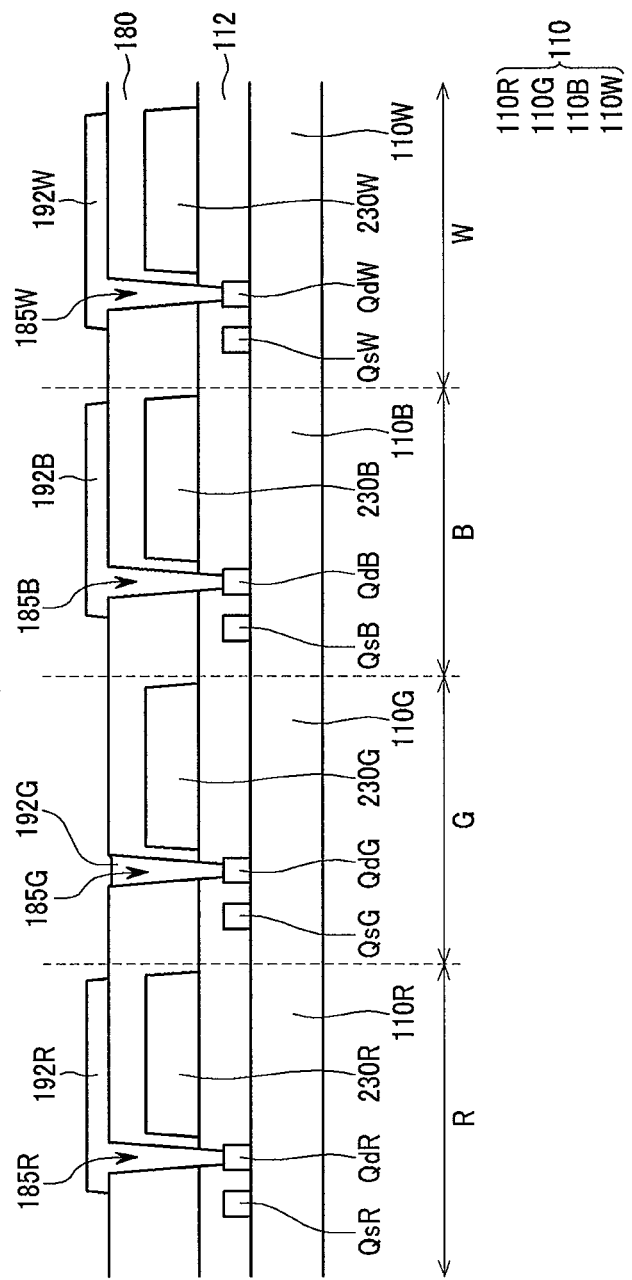

Referring to FIG. 9, a plurality of lower transparent electrodes 192R, 192B, and 192W and transparent conductors 192G are formed by etching the first transparent conductive layer 190p while using the first photoresist pattern 40a as a mask. Here, the transparent conductor 192G of the green pixel G is left in the contact hole 185G by terminating the etching process when the etching process penetrates to the overcoat 180.

Figure 10:
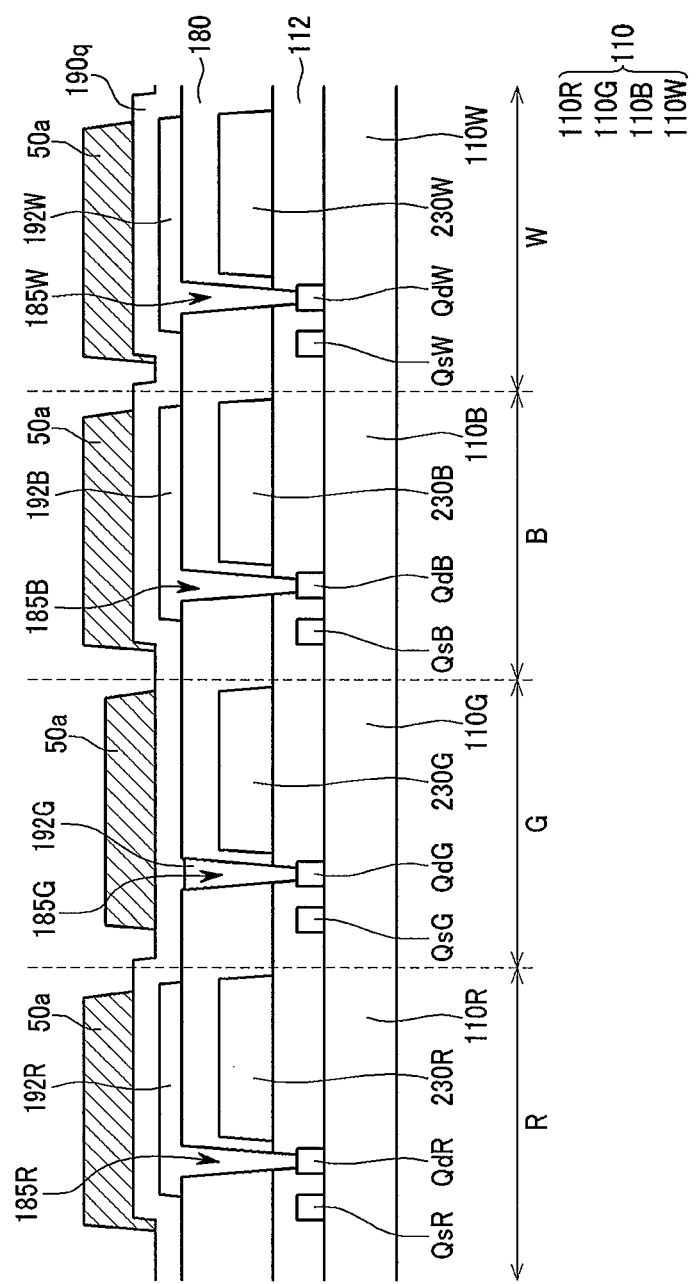

Referring to FIG. 10, a second transparent conductive layer 190q made of ITO or IZO is deposited on the lower transparent electrodes 192R, 192B, and 192W, the transparent conductor 192G, and the overcoat 180, for example by sputtering. Then, a second photoresist pattern 50a is formed on the second transparent conductive layer 190q by coating and patterning a second photosensitive film on the second transparent conductive layer 190q.

Figure 11:
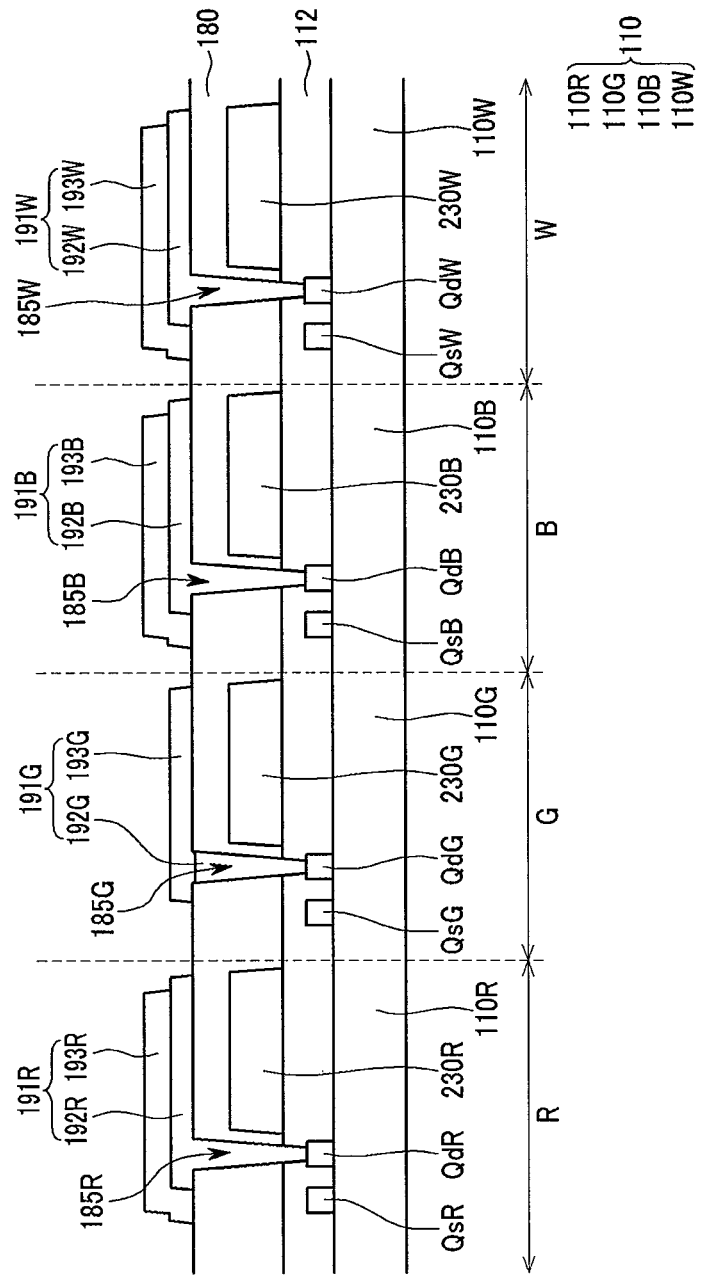

Referring to FIG. 11, a plurality of the upper transparent electrodes 193R, 193B, and 193W and transparent electrodes 193G are formed by etching the second transparent conductive layer 190q using the second photoresist pattern 50a as a mask, thereby completely forming pixel electrodes 191R, 191G, 191B, and 191W of pixels R, G, B, and W, respectively.

Figure 12:
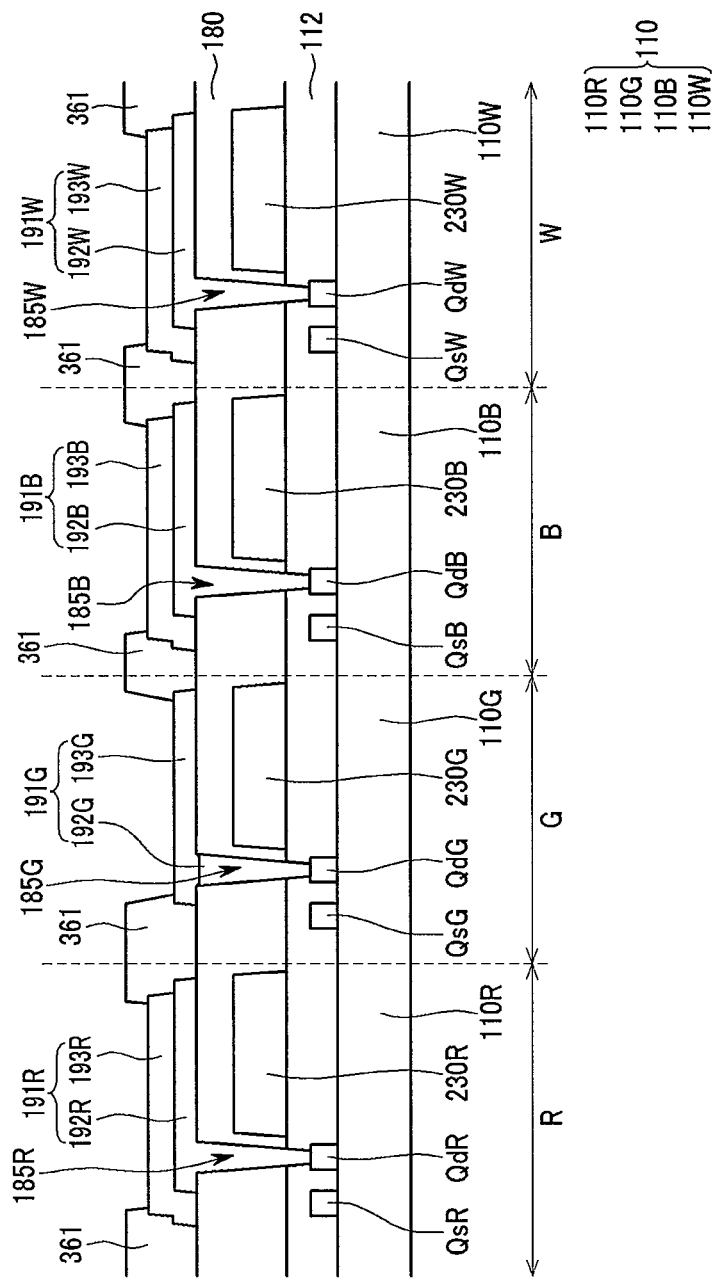

Referring to FIG. 12, an insulating layer is coated on the pixel electrodes 191R, 191G, 191B, and 191W, and the overcoat 180, and a plurality of insulating members 361 are formed by patterning the insulating layer. The insulating members 361 extend between adjacent pixel electrodes and around the perimeter of each pixel electrode.

Finally, as shown in FIG. 3, an organic light emitter including a white organic light emitting member 370 and a common electrode 270 are sequentially formed on the pixel electrodes 191R, 191G, 191B, and 191W, and on insulating members 361.

As described above, the transparent conductor 192G is left in the contact hole 185G of the green pixel G when the lower transparent electrodes 192R, 192B, and 192W are formed. Therefore, the output terminal of the driving transistor QdG is protected from being exposed to an etchant used for etching the first transparent conductive layer 190p and is thus protected from being damaged by the etchant.

An organic light emitting device according to another exemplary embodiment of the present invention will be described with reference to FIG. 1, FIG. 2 and FIG. 13.

Figure 13:
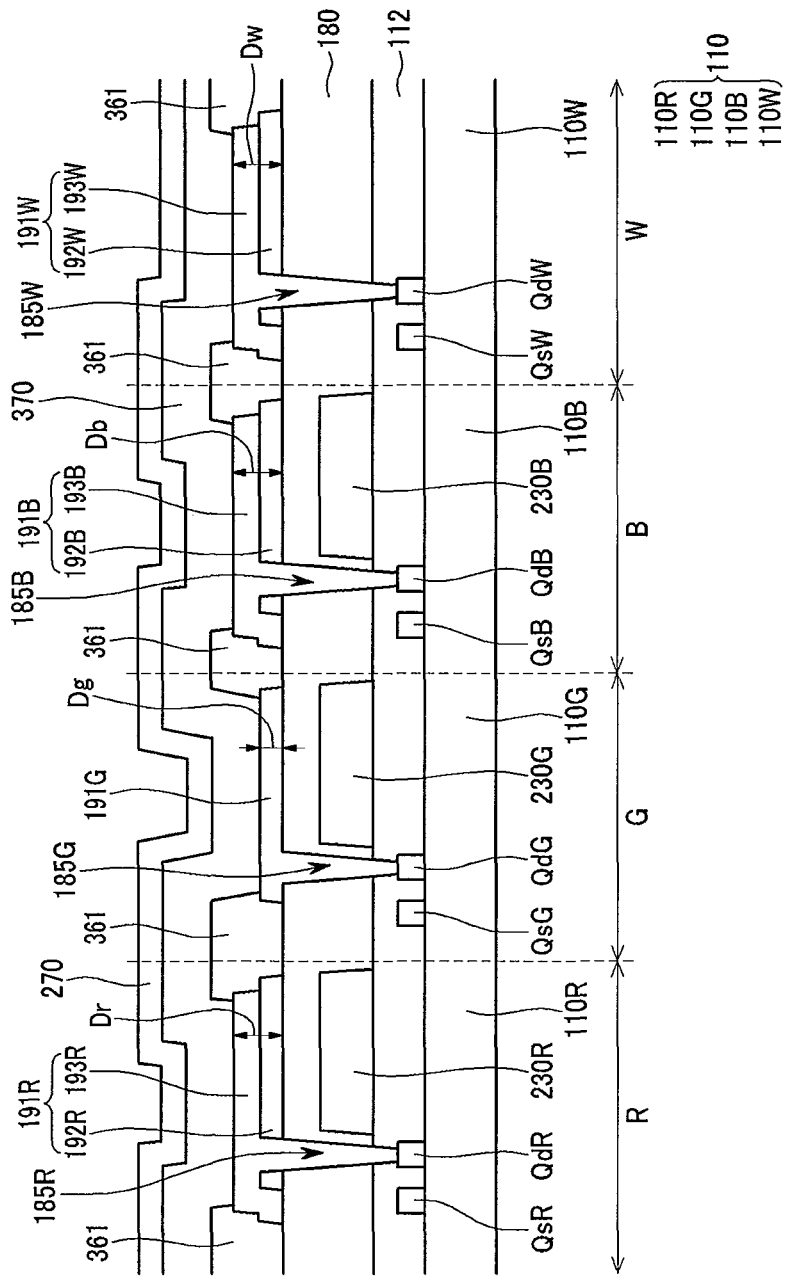
FIG. 13 is a cross-sectional view of an organic light emitting device according to another exemplary embodiment of the present invention.

FIG. 13 is a cross-sectional view of an organic light emitting device according to another exemplary embodiment of the present invention.

The descriptions already provided of like elements in the previous embodiment are omitted here, and like reference numerals are designated to like constituent elements.

A thin film transistor array, an insulating layer 112, a plurality of color filters 230R, 230G, and 230B, an overcoat 180, pixel electrodes 191R, 191G, 191B, and 191W, insulating members 361, an organic light emitter including a white organic light emitting member 370, and a common electrode 270 are sequentially disposed on an insulating substrate 110.

In the organic light emitting device according to the present exemplary embodiment, red color filters 230R, green color filters 230G, and blue color filters 230B are disposed on the insulating layer 112. However, no color filter is provided in the white pixel W. Alternatively, a white color filter may be provided in the white pixel W.

Also, structures of the contact holes 185R, 185G, and 185B and the pixel electrodes 191R, 191G, 191B, and 191W in the present embodiment are different from those in the previously described exemplary embodiment shown in FIG. 3.

Although the pixel electrodes 191R, 191B, and 191W of the red, blue, and white pixels R, B, and W respectively include a lower transparent electrode 192R, 192B and 192W and an upper transparent electrode 193R, 193B and 193W, the pixel electrode 191G of the green pixel G is made of a single layer of a transparent conductive material.

Although the contact holes 185R, 185B, and 185W of the red, blue and white pixels R, B and W penetrate the insulating layer 112, the overcoat 180, and the first transparent electrodes 192R, 192B, and 192W, the contact hole 185G of the green pixel G penetrates only the insulating layer 112 and the overcoat 180. The upper transparent electrodes 193R, 193B, and 193W of the red, blue, and white pixels R, B, and W are electrically connected to the driving transistors QdR, QdB, and QdW through the contact holes 185R, 185B, and 185W, respectively, and the pixel electrode 191G of the green pixel G is electrically connected to the driving transistor QdG through the contact hole 185G.

The thicknesses Dr, Dg, Db, and Dw of the pixel electrodes 191R, 191G, 191B, and 191W are similar to those of the previous exemplary embodiment shown in FIG. 3.

Now, a manufacturing method of the organic light emitting device of FIG. 13 will be described with reference to FIG. 14 to FIG. 18.

FIG. 14 to FIG. 18 are cross-sectional views of the organic light emitting device of FIG. 13 at intermediate steps of a manufacturing method of an organic light emitting device according to an exemplary embodiment of the present invention.

Figure 14:
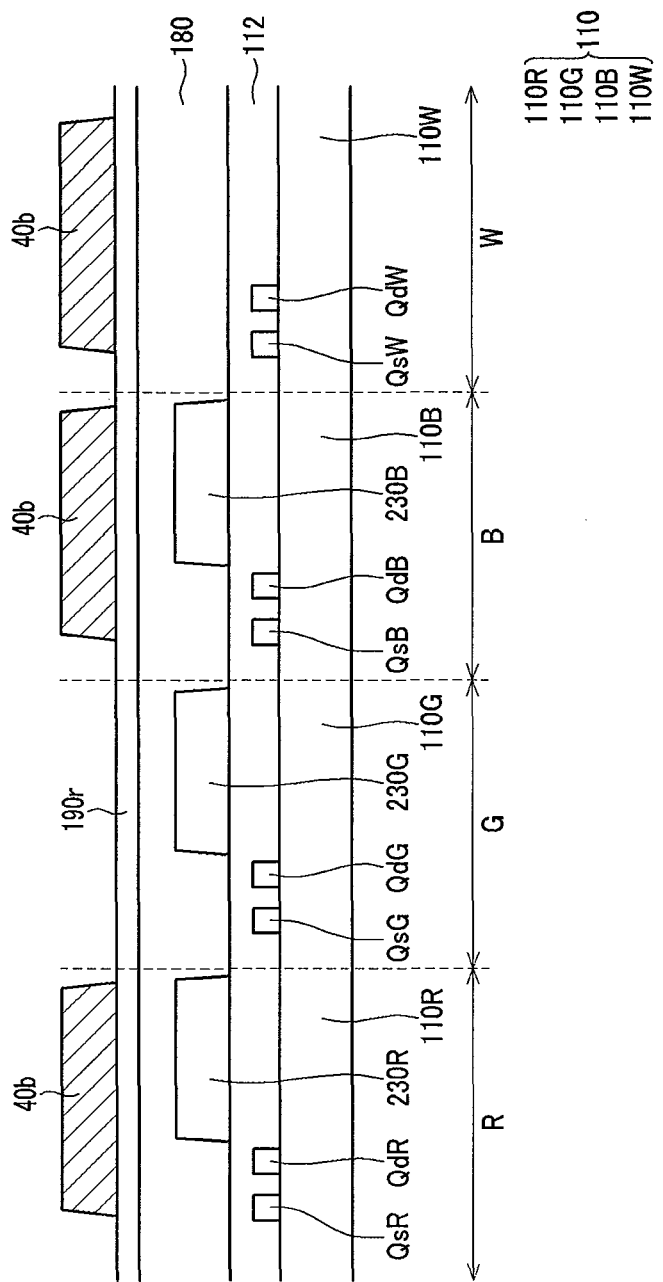
FIG. 14 to FIG. 18 are cross-sectional views of an organic light emitting device of FIG. 13 at intermediate steps of a manufacturing method of an organic light emitting device according to an exemplary embodiment of the present invention.

Referring to FIG. 14, as in the previous exemplary embodiment, a thin film transistor array is formed on an insulating substrate 110. Then, an insulating layer 112, a plurality of color filters 230R, 230G, and 230B, and an overcoat 180 are sequentially formed.

The first transparent conductive layer 190r is deposited on the overcoat 180, and a first photoresist pattern 40b is formed by coating a first photosensitive film on the first transparent conductive layer 190r and patterning the first photosensitive film.

Figure 15:
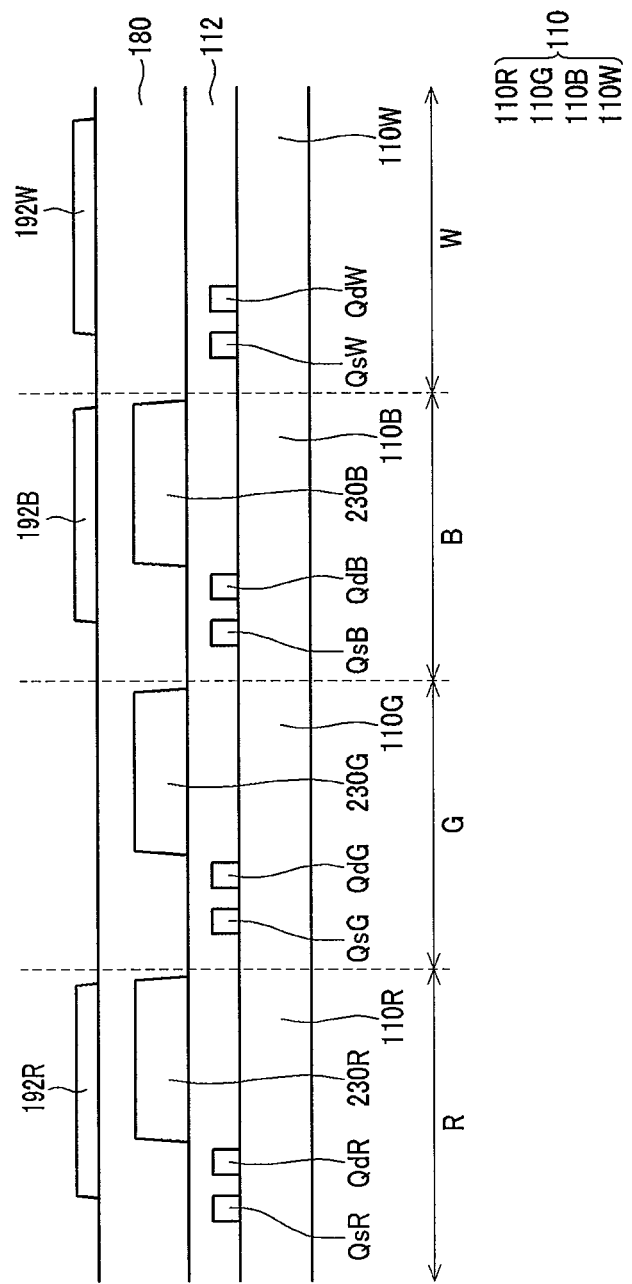

Referring to FIG. 15, a plurality of lower transparent electrodes 192R, 192B, and 192W are formed at the red, blue, and white pixels R, B, and W by etching the first transparent conductive layer 190r while using the first photoresist pattern 40b as a mask.

Figure 16:
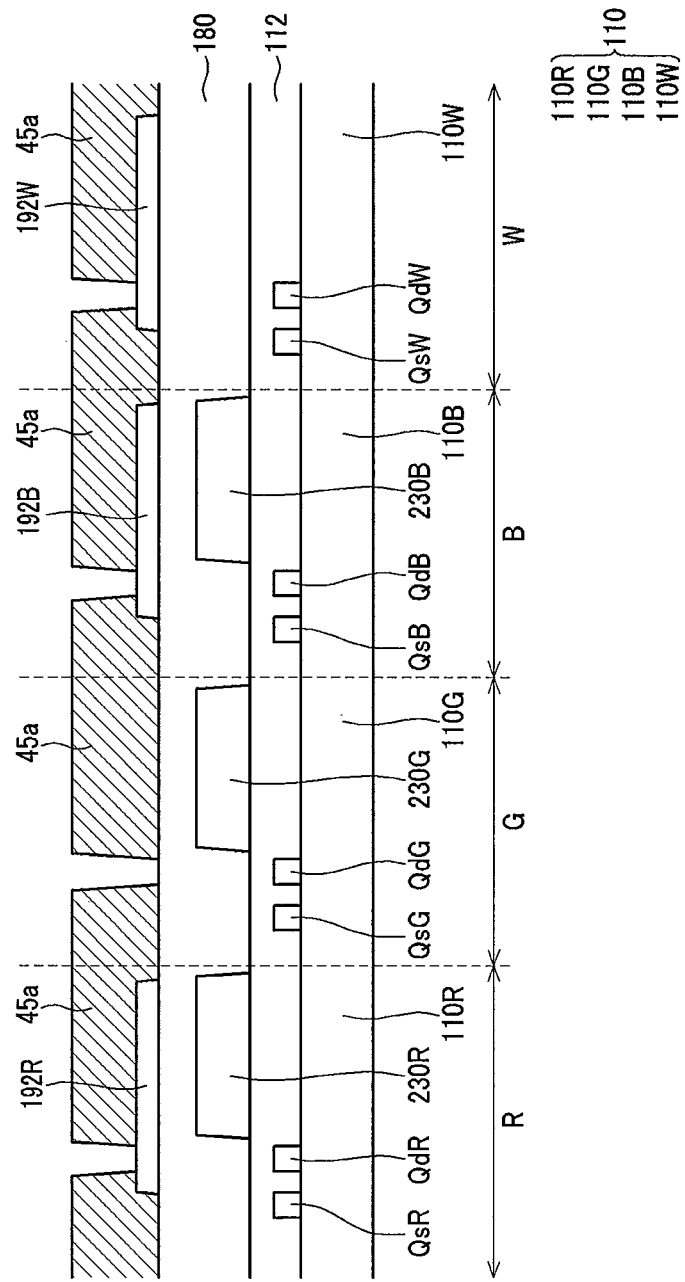
Figure 17:
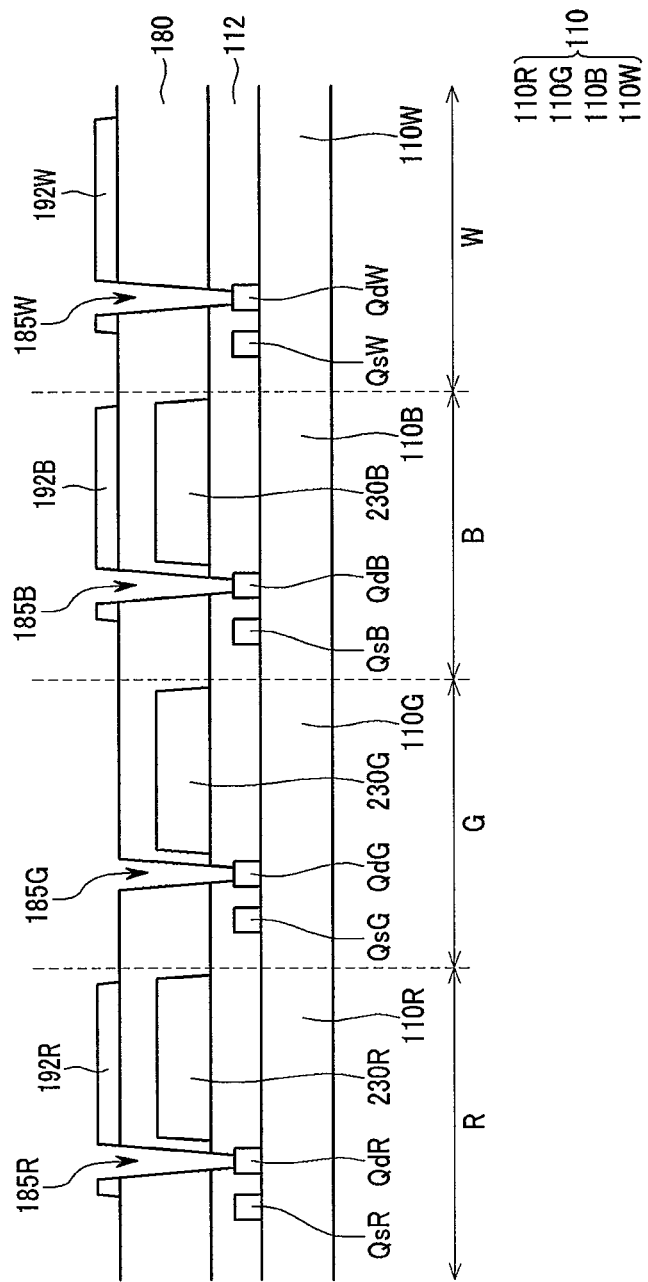

Referring to FIG. 16 and FIG. 17, a second photoresist pattern 45a is formed by coating a second photosensitive film on the lower transparent electrodes 192R, 192B, and 192W, and on the overcoat 180, and patterning the second photosensitive film.

Then, a plurality of contact holes 185R, 185G, 185B, and 185W are formed in the lower transparent electrodes 192R, 192B, and 192W, the overcoat 180, and the insulating layer 112 by etching while using the second photoresist pattern 45a as a mask. Since the contact holes 195R, 185G, 185B, and 185W are formed after the lower transparent electrodes 192R, 192B, and 192W are formed, the driving transistors QdR, QdB, and QdW are prevented from being damaged by an etchant that is used for patterning the lower transparent electrodes 192R, 192B, and 192W.

Figure 18:
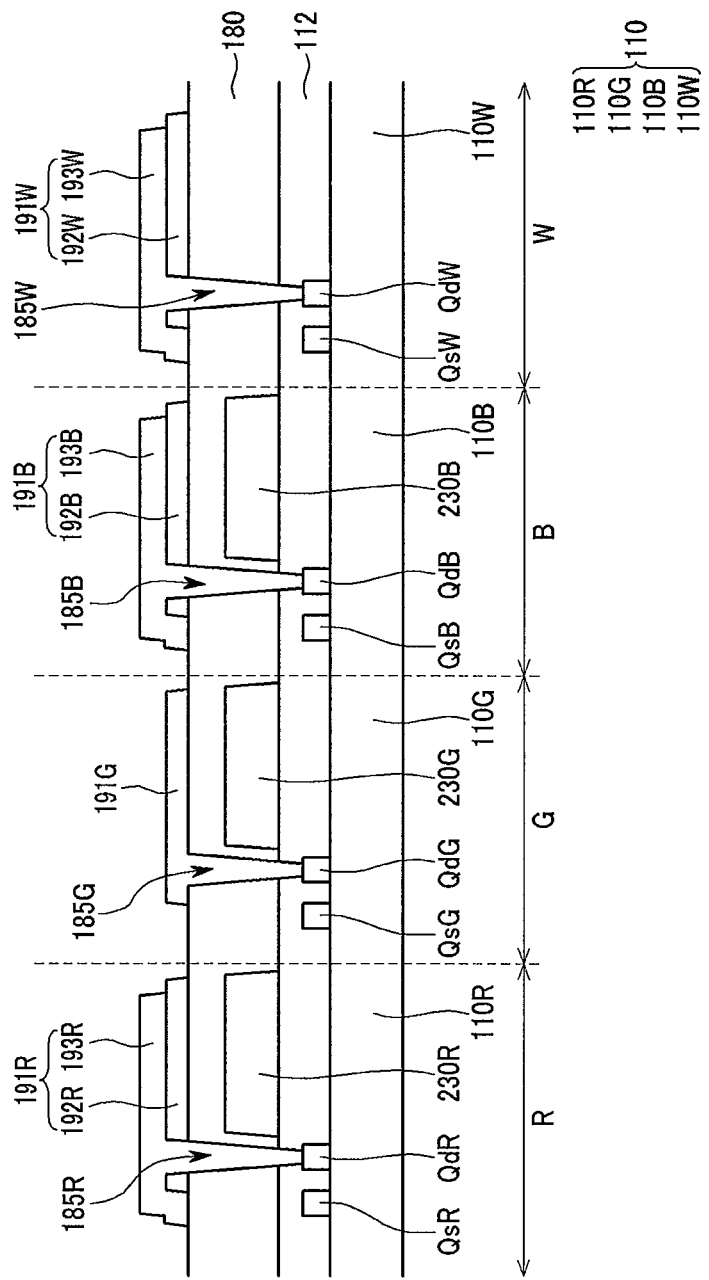

Referring to FIG. 18, a second transparent conductive layer made of ITO or IZO is deposited on the lower transparent electrodes 192R, 192B, and 192W, and the overcoat 180, and a photoresist pattern (not shown) is formed thereon. Then, a plurality of upper transparent electrodes 193R, 193B, and 193W and pixel electrodes 191G of the green pixel G are formed by etching the second transparent conductive layer using the photoresist pattern (not shown) as a mask. The lower transparent electrodes 192R, 192B, and 192W and the upper transparent electrodes 193R, 193B, and 193W of the red, blue, and white pixels R, B, and W form the pixel electrodes 191R, 191B, and 191W, respectively.

Finally, as shown in FIG. 13, a plurality of insulating members 361, a white organic light emitting member 370, and a common electrode 270 are sequentially formed on the pixel electrodes 191R, 191G, 191B, and 191W and the overcoat 180.

An organic light emitting device according to two other exemplary embodiments will be described with reference to FIG. 19 and FIG. 20 as well as FIG. 1 and FIG. 2.

Figure 19:
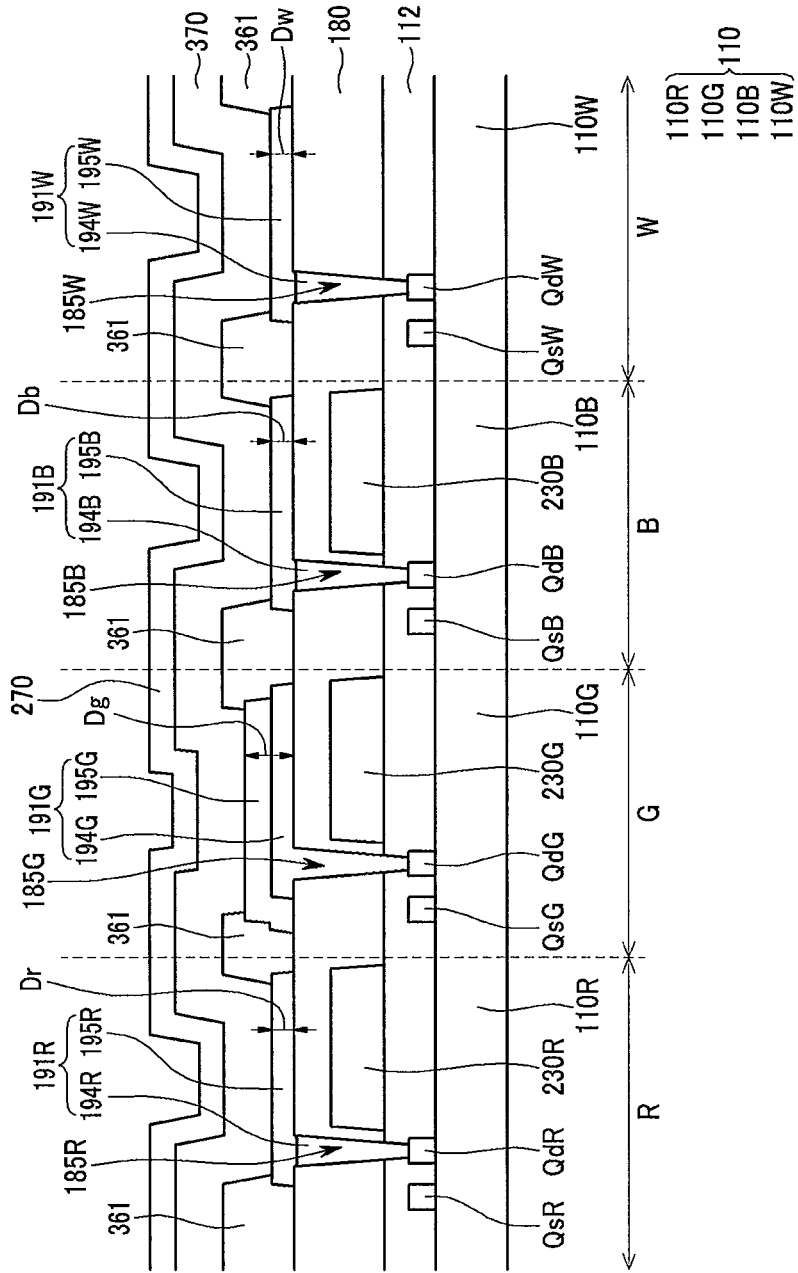
FIG. 19 and FIG. 20 are cross-sectional views of organic light emitting devices according to exemplary embodiments of the present invention.
Figure 20:
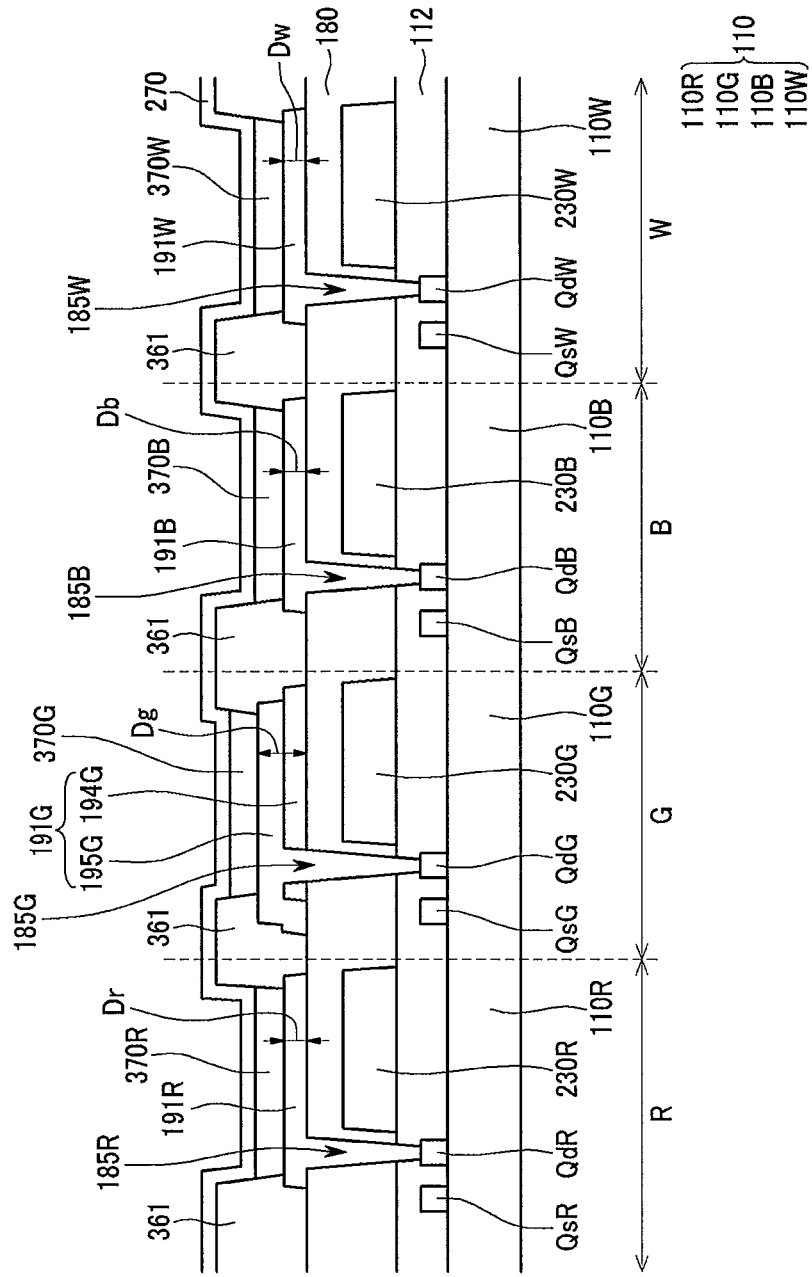

FIG. 19 and FIG. 20 are cross-sectional views of organic light emitting devices according to exemplary embodiments of the present invention.

The descriptions of like elements previously described are here omitted, and like reference numerals are designated to like constituent elements.

Referring to FIG. 19, an organic light emitting device according to the present exemplary embodiment has a structure that is similar to that shown in FIG. 3 except for the pixel electrodes 191R, 191G, 191B, and 191W.

Unlike the organic light emitting device shown in FIG. 3, the pixel electrode 191G of the green pixel G includes a lower transparent electrode 194G and an upper transparent electrode 195G, and the pixel electrodes 191R, 191B, and 191W of the red, blue, and white pixels R, B, and W respectively include transparent electrodes 195R, 195B, and 195W made of a single second transparent conductive layer and transparent conductors 194R, 194B, and 194W made from a first transparent conductive layer and disposed in the respective contact holes 185R, 185B, and 185W.

In the present exemplary embodiment, a thickness Dg of the pixel electrode 191G of the green pixel G is greater than that of the pixel electrodes 191R, 191B, and 191W of the red, blue, and white pixels R, B, and W. The thickness Dg of the pixel electrode 191G may be between about 1400 Å and about 1600 Å, and the thicknesses Dr, Db, and Dw of the red, blue, and white pixels R, B, and W may be between about 800 Å and about 1000 Å. The thicknesses Dr, Db, and Dw are substantially equal.

In the previous exemplary embodiments shown in FIGS. 3 and 13, light that is reflected repeatedly at a boundary between the green pixel electrode 191G and the overcoat 180 and at the common electrode 270 is finally emitted as light that contains a strong green component which is then separated by a green filter. In the previous exemplary embodiments the green pixel electrode is between about 300 Å and about 500Å thick and has an index of refraction between 1.5 and 1.7.

In the present embodiment, the green pixel G has a different optical path length from the previous embodiments. The thickness of the green pixel electrode is increased to between about 1400 Å and about 1600 Å while the index of refraction is again between about 1.5 and about 1.7, and light experiences an optical process such as constructive interference under different conditions to again be emitted from the green pixel electrode 191G as light that contains a strong green component. Therefore, it is possible to obtain light having a desired range of wavelength and desired color purity for respective primary colors including green. Also, it is possible to reduce color variation and to improve transmittance.

Also, in the present exemplary embodiment, color filters are omitted in the white pixel W although red color filters 230R, green color filters 230G, and blue color filters 230B are disposed on the insulating layer 112.

Next, referring to FIG. 20, an organic light emitting device according to another exemplary embodiment that is similar to the organic light emitting device of FIG. 19 except for the color filters 230R, 230G, 230B, and 230W, the pixel electrodes 191R, 191G, 191B, and 191W, the insulating members 361, and the organic light emitting members 370R, 370G, 370B, and 370W.

In the organic light emitting device according to the present exemplary embodiment as shown in FIG. 20, color filters including red color filters 230R, green color filters 230G, blue color filters 230B, and white color filters 230W are disposed on the insulating layer 112.

The pixel electrode 191G of the green pixel G includes a lower transparent electrode 194G formed in a first layer of transparent conductive material at a lower side and an upper transparent electrode 195G formed in a second layer of transparent conductive material at an upper side. The pixel electrodes 191R, 191B, and 191W of red, blue, and white pixels R, B, and W are made of a single layer of a transparent conductive material, which layer may be the second layer.

Also, while the contact holes 185R, 185B, and 185W of the red pixel R, the blue pixel B, and the white pixel B penetrate the insulating layer 112 and the overcoat 180, the contact hole 185G of the green pixel G penetrates the insulating layer 112, the overcoat 180, and the lower transparent electrode 194G. The upper transparent electrode 195G of the green pixel G is connected to the driving transistor QdG through the contact hole 185G, and the pixel electrodes 191R, 191B, and 191W of the red pixel R, the blue pixel B, and the white pixel W are electrically connected to driving transistors QdR, QdB, and QdW through the contact holes 185R, 185B, and 185W, respectively.

The thicknesses Dr, Dg, Db, and Dw of the pixel electrodes 191R, 191G, 191B, and 191W may be substantially the same as those of the organic light emitting device of FIG. 19.

A plurality of insulating members 361 is disposed on the overcoat 180 between adjacent pixel electrodes 191R, 191G, 191B, and 191W. Each insulating member 361 defines an opening by surrounding the edges of the pixel electrodes 191R, 191G, 191B, and 191W, and may be made of an organic insulator or an inorganic insulator.

In this embodiment, the organic light emitter includes red, green, blue, and white organic light emitting members 370R, 370G, 370B, and 370W disposed in the openings that are surrounded by the insulating members 361 at the red pixel R, the green pixel G, the blue pixel B, and the white pixel W, respectively. The red, green, blue, and white organic light emitting members 370R, 370G, 370B, and 370W are made of organic materials each uniquely emitting one of red, green, blue, and white light. The white organic light emitting member 370W may have a stacked structure of a plurality of organic material layers each emitting a different color of light.

In such a way, organic light emitting members 370R, 370G, 370B, and 370W each of which uniquely emits one of red, green, blue, and white light are disposed at pixels R, G, B, and W, respectively. Therefore, color reproducibility may be further improved.

The white color filters 230W of the white pixels W may be omitted.

Alternatively, the red, green, blue, and white color filters 230R, 230G, 230B, and 230W may be omitted.

Figure 21:
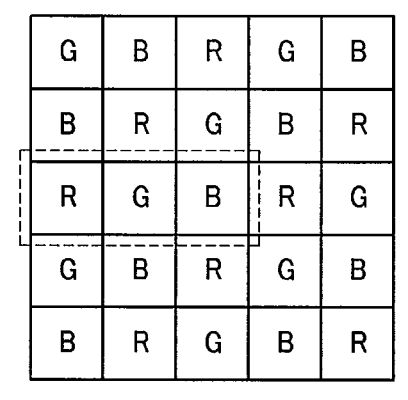
Figure 22:
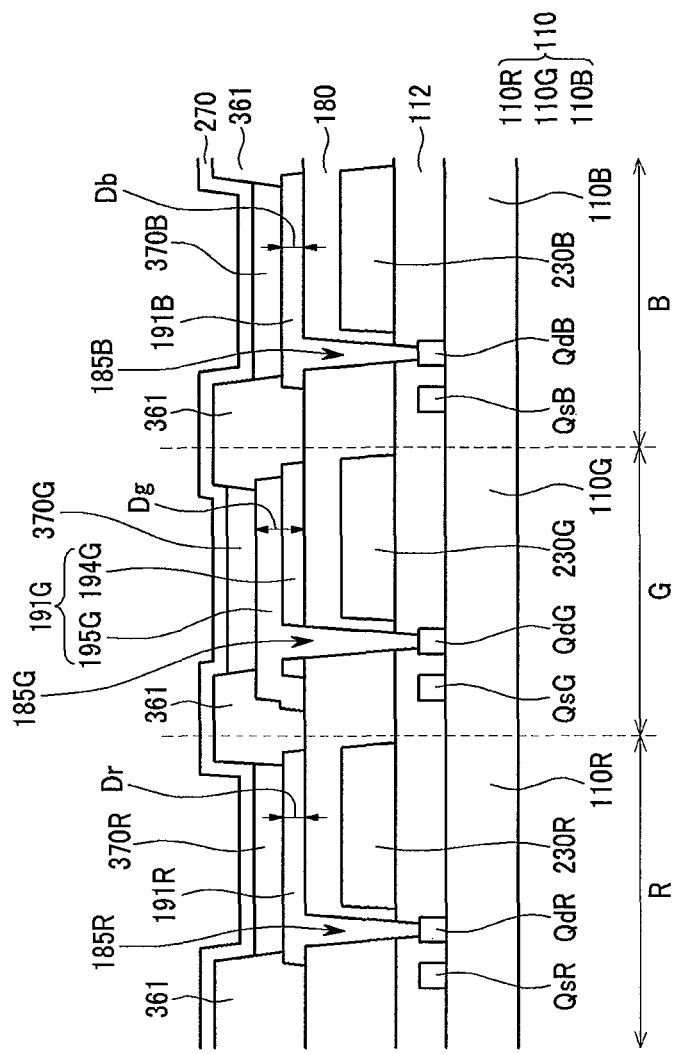
FIG. 22 is a cross-sectional view of the organic light emitting device of FIG. 21 according to another exemplary embodiment of the present invention.

With reference to FIG. 21 and FIG. 22, an organic light emitting device according to another exemplary embodiment of the present invention will be described in detail.

FIG. 21 is a plan view illustrating a plurality of pixels disposed in an organic light emitting device according to another exemplary embodiment of the present invention, and FIG. 22 is a cross-sectional view of the organic light emitting device according to this exemplary embodiment of the present invention.

Referring to FIG. 21, an organic light emitting device includes red pixels R, green pixels G, and blue pixels B, which are disposed in that order in rows of pixels.

The three pixels including a red pixel R, a green pixel G, and a blue pixel B form one group, and the group of pixels R, G and B is disposed repeatedly along the rows and columns. Adjacent rows are offset so that columns include groups of pixels R, G, and B. However, the pixel layout and the pixel shape may be modified in various ways.

Referring to FIG. 22, an organic light emitting device according to the present exemplary embodiment has a stacked structure that is similar to that of the organic light emitting device of FIG. 20.

However, the organic light emitting device according to the present exemplary embodiment includes only pixels of three colors, red, green, and blue pixels R, G, and B. Since the pixel electrodes 191R, 191G, and 191B and the organic light emitting members 370R, 370G, and 370B are the same as those of the organic light emitting device shown in FIG. 20, further descriptions thereof are omitted.

Various features of the organic light emitting device of FIG. 20 may be applied to the organic light emitting device of the present exemplary embodiment.

Various features of the organic light emitting device and the manufacturing method thereof shown in FIG. 1 to FIG. 18 may be applied to the organic light emitting devices shown in FIG. 19 to FIG. 22. Also, color filters of the organic light emitting device and the structure and arrangement of the organic light emitting members according to various exemplary embodiments of the present invention may be modified in various ways.

In this way, display characteristics such as color reproducibility and viewing angle characteristics of an organic light emitting device may be improved. Also, during a manufacturing process of an organic light emitting device, thin film transistors may be prevented from being damaged.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting device comprising:
   a substrate including a first region, a second region, a third region, and a fourth region corresponding to a red pixel, a green pixel, a blue pixel, and a white pixel, respectively;
   a thin film transistor array disposed on the substrate and comprising a first driving transistor disposed on the first region, a second driving transistor disposed on the second region, a third driving transistor disposed on the third region and a fourth driving transistor disposed on the fourth region;
   an overcoat disposed on the thin film transistor;
   first, second, third, and fourth pixel electrodes disposed on and contacting the overcoat, the first pixel electrode being disposed on the first region, the second pixel electrode being disposed on the second region, the third pixel electrode being disposed on the third region, and the fourth pixel electrode being disposed on the fourth region;
   an organic light emitter disposed on the first, the second, the third, and the fourth pixel electrodes; and
   a common electrode disposed on the organic light emitter,
   wherein thicknesses of the first, the third, and the fourth pixel electrodes are substantially equal to each other and different from a thickness of the second pixel electrode,
   wherein the second pixel electrode comprises a lower transparent electrode and an upper transparent electrode,
   wherein first, second, third, and fourth contact holes, formed in the overcoat, extend to the first, the second, the third, and the fourth driving transistors, respectively,
   wherein the first, the third, and the fourth pixel electrodes contact the portions of the first, the third, and the fourth driving transistors through the first, the third, and the fourth contact holes,
   wherein the upper transparent electrode of the second pixel electrode contacts the second driving transistor through the second contact hole, and
   wherein the second contact hole penetrates the lower transparent electrode of the second pixel electrode.

2. The organic light emitting device of claim 1, wherein the first, the second, the third, and the fourth pixel electrodes comprise ITO or IZO.

3. The organic light emitting device of claim 2, wherein the overcoat comprises an organic material.

4. An organic light emitting display, comprising:
   a substrate including a first region, a second region, a third region, and a fourth region corresponding to a red pixel, a green pixel, a blue pixel, and a white pixel, respectively;
   a thin film transistor array disposed on the substrate and comprising a first driving transistor disposed on the first region, a second driving transistor disposed on the second region, a third driving transistor disposed on the third region and a fourth driving transistor disposed on the fourth region;
   color filters including a red color filter, a green color filter and a blue color filter disposed on the thin film transistor array and disposed at the first region, the second region, and the third region, respectively;
   an overcoat disposed on the color filters;
   first, second, third, and fourth pixel electrodes disposed on and contacting the overcoat, the first pixel electrode being disposed on the first region, the second pixel electrode being disposed on the second region, the third pixel electrode being disposed on the third region, and the fourth pixel electrode being disposed on the fourth region;
   an organic light emitter disposed on the first, the second, the third, and the fourth pixel electrodes; and
   a common electrode disposed on the organic light emitter,
   wherein thicknesses of the first, the third, and the fourth pixel electrodes are substantially equal to each other and different from a thickness of the second pixel electrode, and
   wherein each of the color filters is disposed between the thin film transistor array and the pixel electrode,
   wherein the first, the second, the third and the fourth pixel electrodes have a first, a second, a third and a fourth lower pixel electrodes and a first, a second, a third and a fourth upper pixel electrodes respectively, and
   wherein the second lower pixel electrode includes a transparent conductive layer and is substantially formed only in a contact hole formed in the overcoat and exposing portion of the second driving transistors.

5. The organic light emitting device of claim 1, wherein a refractive index difference between the overcoat and the first, the second, the third and the fourth pixel electrodes is 0.2 or greater.

6. The organic light emitting device of claim 5, wherein the second pixel electrode is thicker than the first, the third, and the fourth pixel electrodes.

7. The organic light emitting device of claim 6, wherein the thickness of the second pixel electrode is between about 1400 Å and about 1600 Å, and the thickness of the first, the third, and the fourth pixel electrodes is between about 800 Å and about 1000 Å.

8. The organic light emitting device of claim 5, wherein the second pixel electrode is thinner than the first, the third, and the fourth pixel electrodes.

9. The organic light emitting device of claim 8, wherein the thickness of the second pixel electrode is between about 300 Å and about 500 Å, and the thickness of the first, the third, and the fourth pixel electrodes is between about 800 Å and about 1000 Å.

10. The organic light emitting device of claim 1, wherein the second pixel electrode is thicker than the first, the third, and the fourth pixel electrodes.

11. The organic light emitting device of claim 10, wherein the thickness of the second pixel electrode is between about 1400 Å and about 1600 Å, and the thickness of the first, the third, and the fourth pixel electrodes is between about 800 Å and about 1000 Å.

12. The organic light emitting device of claim 4, wherein the second pixel electrode is thinner than the first, the third, and the fourth pixel electrodes.

13. The organic light emitting device of claim 12, wherein the thickness of the second pixel electrode is between about 300 Å and about 500 Å, and the thickness of the first, the third, and the fourth pixel electrodes is between about 800 Å and about 1000 Å.

14. An organic light emitting display, comprising:
a substrate including a first region, a second region, a third region, and a fourth region corresponding to a red pixel, a green pixel, a blue pixel, and a white pixel, respectively;
a thin film transistor array disposed on the substrate and comprising a first driving transistor disposed on the first region, a second driving transistor disposed on the second region, a third driving transistor disposed on the third region and a fourth driving transistor disposed on the fourth region;
color filters including a red color filter, a green color filter and a blue color filter disposed on the thin film transistor array and disposed at the first region, the second region, and the third region, respectively;
an overcoat disposed on the color filters;
first, second, third, and fourth pixel electrodes disposed on and contacting the overcoat, the first pixel electrode being disposed on the first region, the second pixel electrode being disposed on the second region, the third pixel electrode being disposed on the third region, and the fourth pixel electrode being disposed on the fourth region;
an organic light emitter disposed on the first, the second, the third, and the fourth pixel electrodes; and
a common electrode disposed on the organic light emitter,
wherein thicknesses of the first, the third, and the fourth pixel electrodes are substantially equal to each other and different from a thickness of the second pixel electrode, and
wherein each of the color filters is disposed between the thin film transistor array and the pixel electrode,
wherein the first, the second, the third and the fourth pixel electrodes have a first, a second, a third and a fourth lower pixel electrodes and a first, a second, a third and a fourth upper pixel electrodes respectively, and
wherein the first, the third and the fourth upper pixel electrode is connected to the first, the third and the fourth transistors through contact holes formed in the first, the third and the fourth lower pixel electrodes and the overcoat respectively.

15. The organic light emitting device of claim 14, wherein a refractive index difference between the overcoat and the first, the second, the third and the fourth pixel electrodes is 0.2 or greater.

16. The organic light emitting device of claim 15, wherein the second pixel electrode is thicker than the first, the third, and the fourth pixel electrodes.

17. The organic light emitting device of claim 16, wherein the thickness of the second pixel electrode is between about 1400 Å and about 1600 Å, and the thickness of the first, the third, and the fourth pixel electrodes is between about 800 Å and about 1000 Å.

18. The organic light emitting device of claim 15, wherein the second pixel electrode is thinner than the first, the third, and the fourth pixel electrodes.

19. The organic light emitting device of claim 18, wherein the thickness of the second pixel electrode is between about 300 Å and about 500 Å, and the thickness of the first, the third, and the fourth pixel electrodes is between about 800 Å and about 1000 Å.

20. The organic light emitting device of claim 14, wherein the second pixel electrode is thicker than the first, the third, and the fourth pixel electrodes.

21. The organic light emitting device of claim 20, wherein the thickness of the second pixel electrode is between about 1400 Å and about 1600 Å, and the thickness of the first, the third, and the fourth pixel electrodes is between about 800 Å and about 1000 Å.

22. The organic light emitting device of claim 14, wherein the second pixel electrode is thinner than the first, the third, and the fourth pixel electrodes.

23. The organic light emitting device of claim 22, wherein the thickness of the second pixel electrode is between about 300 Å and about 500 Å, and the thickness of the first, the third, and the fourth pixel electrodes is between about 800 Å and about 1000 Å.

24. An organic light emitting display, comprising:
a substrate including a first region, a second region, a third region, and a fourth region corresponding to a red pixel, a green pixel, a blue pixel, and a white pixel, respectively;
a thin film transistor array disposed on the substrate and comprising a first driving transistor disposed on the first region, a second driving transistor disposed on the second region, a third driving transistor disposed on the third region and a fourth driving transistor disposed on the fourth region;
color filters including a red color filter, a green color filter and a blue color filter disposed on the thin film transistor array and disposed at the first region, the second region, and the third region, respectively;
an overcoat disposed on the color filters;

first, second, third, and fourth pixel electrodes disposed on and contacting the overcoat, the first pixel electrode being disposed on the first region, the second pixel electrode being disposed on the second region, the third pixel electrode being disposed on the third region, and the fourth pixel electrode being disposed on the fourth region;

an organic light emitter disposed on the first, the second, the third, and the fourth pixel electrodes; and a common electrode disposed on the organic light emitter, wherein thicknesses of the first, the third, and the fourth pixel electrodes are substantially equal to each other and different from a thickness of the second pixel electrode, and wherein each of the color filters is disposed between the thin film transistor array and the pixel electrode, wherein the first, the second, the third and the fourth pixel electrodes have a first, a second, a third and a fourth lower pixel electrodes and a first, a second, a third and a fourth upper pixel electrodes respectively, and wherein the first, the third and the fourth lower pixel electrodes include transparent conductive layers and are substantially formed only in contact holes formed in the overcoat and exposing portion of the first, the third and the fourth driving transistors.

25. The organic light emitting device of claim 24, wherein a refractive index difference between the overcoat and the first, the second, the third and the fourth pixel electrodes is 0.2 or greater.

26. The organic light emitting device of claim 25, wherein the second pixel electrode is thicker than the first, the third, and the fourth pixel electrodes.

27. The organic light emitting device of claim 26, wherein the thickness of the second pixel electrode is between about 1400 Å and about 1600 Å, and the thickness of the first, the third, and the fourth pixel electrodes is between about 800 Å and about 1000 Å.

28. The organic light emitting device of claim 25, wherein the second pixel electrode is thinner than the first, the third, and the fourth pixel electrodes.

29. The organic light emitting device of claim 28, wherein the thickness of the second pixel electrode is between about 300 Å and about 500 Å, and the thickness of the first, the third, and the fourth pixel electrodes is between about 800 Å and about 1000 Å.

30. The organic light emitting device of claim 24, wherein the second pixel electrode is thicker than the first, the third, and the fourth pixel electrodes.

31. The organic light emitting device of claim 30, wherein the thickness of the second pixel electrode is between about 1400 Å and about 1600 Å, and the thickness of the first, the third, and the fourth pixel electrodes is between about 800 Å and about 1000 Å.

32. The organic light emitting device of claim 24, wherein the second pixel electrode is thinner than the first, the third, and the fourth pixel electrodes.

33. The organic light emitting device of claim 32, wherein the thickness of the second pixel electrode is between about 300 Å and about 500 Å, and the thickness of the first, the third, and the fourth pixel electrodes is between about 800 Å and about 1000 Å.

34. An organic light emitting display, comprising:

a substrate including a first region, a second region, a third region, and a fourth region corresponding to a red pixel, a green pixel, a blue pixel, and a white pixel, respectively;

a thin film transistor array disposed on the substrate and comprising a first driving transistor disposed on the first region, a second driving transistor disposed on the second region, a third driving transistor disposed on the third region and a fourth driving transistor disposed on the fourth region;

color filters including a red color filter, a green color filter and a blue color filter disposed on the thin film transistor array and disposed at the first region, the second region, and the third region, respectively;

an overcoat disposed on the color filters;

first, second, third, and fourth pixel electrodes disposed on and contacting the overcoat, the first pixel electrode being disposed on the first region, the second pixel electrode being disposed on the second region, the third pixel electrode being disposed on the third region, and the fourth pixel electrode being disposed on the fourth region;

an organic light emitter disposed on the first, the second, the third, and the fourth pixel electrodes; and a common electrode disposed on the organic light emitter, wherein thicknesses of the first, the third, and the fourth pixel electrodes are substantially equal to each other and different from a thickness of the second pixel electrode, and wherein each of the color filters is disposed between the thin film transistor array and the pixel electrode, wherein the first, the second, the third and the fourth pixel electrodes have a first, a second, a third and a fourth lower pixel electrodes and a first, a second, a third and a fourth upper pixel electrodes respectively, and wherein the upper pixel electrodes of the second pixel electrode is connected to the second transistor through a contact hole formed in the second lower pixel electrodes and the overcoat.

35. The organic light emitting device of claim 34, wherein a refractive index difference between the overcoat and the first, the second, the third and the fourth pixel electrodes is 0.2 or greater.

36. The organic light emitting device of claim 35, wherein the second pixel electrode is thicker than the first, the third, and the fourth pixel electrodes.

37. The organic light emitting device of claim 36, wherein the thickness of the second pixel electrode is between about 1400 Å and about 1600 Å, and the thickness of the first, the third, and the fourth pixel electrodes is between about 800 Å and about 1000 Å.

38. The organic light emitting device of claim 35, wherein the second pixel electrode is thinner than the first, the third, and the fourth pixel electrodes.

39. The organic light emitting device of claim 38, wherein the thickness of the second pixel electrode is between about 300 Å and about 500 Å, and the thickness of the first, the third, and the fourth pixel electrodes is between about 800 Å and about 1000 Å.

40. The organic light emitting device of claim 34, wherein the second pixel electrode is thicker than the first, the third, and the fourth pixel electrodes.

41. The organic light emitting device of claim 40, wherein the thickness of the second pixel electrode is between about 1400 Å and about 1600 Å, and the thickness of the first, the third, and the fourth pixel electrodes is between about 800 Å and about 1000 Å.

42. The organic light emitting device of claim 34, wherein the second pixel electrode is thinner than the first, the third, and the fourth pixel electrodes.

43. The organic light emitting device of claim 42, wherein the thickness of the second pixel electrode is between about 300 Å and about 500 Å, and the thickness of the first, the third, and the fourth pixel electrodes is between about 800 Å and about 1000 Å.

* * * * *